(12) United States Patent
Zhang et al.

(10) Patent No.: US 11,882,734 B2
(45) Date of Patent: Jan. 23, 2024

(54) DISPLAY SUBSTRATE AND MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bo Zhang, Beijing (CN); Xiangdan Dong, Beijing (CN); Rong Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 813 days.

(21) Appl. No.: 16/977,526

(22) PCT Filed: Nov. 22, 2019

(86) PCT No.: PCT/CN2019/120221
§ 371 (c)(1),
(2) Date: Sep. 2, 2020

(87) PCT Pub. No.: WO2021/097798
PCT Pub. Date: May 27, 2021

(65) Prior Publication Data
US 2022/0399422 A1    Dec. 15, 2022

(51) Int. Cl.
*H10K 59/131*    (2023.01)
*H10K 50/844*    (2023.01)
(Continued)

(52) U.S. Cl.
CPC ......... *H10K 59/131* (2023.02); *H10K 50/844* (2023.02); *H10K 71/00* (2023.02); *H10K 59/1201* (2023.02)

(58) Field of Classification Search
CPC .. H10K 59/131; H10K 59/1201; H10K 59/65; H10K 59/88; H10K 50/844; H10K 71/00
See application file for complete search history.

(56) References Cited

U.S. PATENT DOCUMENTS

2022/0115487 A1* 4/2022 Shu ................. H10K 59/131

FOREIGN PATENT DOCUMENTS

| EP | 1923738 A2 | 6/2008 |
|---|---|---|
| EP | 3176771 A2 | 6/2017 |

OTHER PUBLICATIONS

Extended European Search Report from European Patent Application No. 19945439.8 dated Oct. 21, 2022.

* cited by examiner

*Primary Examiner* — Anne M Hines
*Assistant Examiner* — Jose M Diaz
(74) *Attorney, Agent, or Firm* — Dilworth & Barrese, LLP.; Michael J. Musella, Esq.

(57) ABSTRACT

A display substrate and a manufacturing method thereof, and a display device are provided. The display substrate includes a display region and a peripheral region. The display region includes an opening, and the peripheral region includes a first peripheral region; the first peripheral region includes a first dam region, a second dam region, and an interval region; the display substrate includes a base substrate, a first conductive semiconductor pattern, a first conductive pattern, and a second conductive pattern; the first conductive pattern is insulated from the first conductive semiconductor pattern, and the second conductive pattern is insulated from the first conductive pattern; the second conductive pattern is electri- (Continued)

cally connected to the first conductive semiconductor pattern through via holes in the first peripheral region; and an arrangement density of the via holes in the interval region is smaller than an arrangement density of the via holes in the first dam region.

20 Claims, 9 Drawing Sheets

(51) Int. Cl.
*H10K 71/00* (2023.01)
*H10K 59/12* (2023.01)

DISPLAY SUBSTRATE AND MANUFACTURING METHOD THEREOF, AND DISPLAY DEVICE

TECHNICAL FIELD

Embodiments of the present disclosure relate to a display substrate and a manufacturing method thereof, and a display device.

BACKGROUND

Organic light-emitting diode (OLED) display devices have advantages of the thin thickness, light weight, wide viewing angle, active light emission, continuously adjustable light emission color, low cost, fast response speed, low energy consumption, low driving voltage, wide operation temperature range, simple manufacturing process, high light emission efficiency, flexible display, etc., and have been more and more widely used in display fields such as mobile phones, tablet computers, and digital cameras.

In the manufacturing process, it is usually necessary to package the display component in the OLED display device to prevent the intrusion of moisture, oxygen, or the like. The packaging technology of the OLED display device mainly includes a cover plate packaging technology and a thin film packaging technology. The thin film packaging technology mainly includes packaging with an organic encapsulation layer and/or packaging with an inorganic encapsulation layer. In the case where the display component is packaged using the thin film packaging technology, the formed organic encapsulation layer and the formed inorganic encapsulation layer are stacked alternately, so that it is difficult for moisture, oxygen, or the like to penetrate into the interior of the display component.

SUMMARY

At least one embodiment of the present disclosure provides a display substrate, and the display substrate includes a display region and a peripheral region around the display region; the display region includes an opening, and the peripheral region includes a first peripheral region at least partially around the opening; the first peripheral region includes a first dam region, a second dam region, and an interval region, the first dam region is at least partially around the opening, the interval region is at least partially around the first dam region, and the second dam region is at least partially around the interval region; the display substrate includes a base substrate, a first conductive semiconductor pattern, a first conductive pattern, and a second conductive pattern; the first conductive semiconductor pattern is on the base substrate, the first conductive pattern is on a side of the first conductive semiconductor pattern away from the base substrate, and is spaced apart and insulated from the first conductive semiconductor pattern to form a capacitor, and the second conductive pattern is on a side of the first conductive pattern away from the first conductive semiconductor pattern, and is spaced apart and insulated from the first conductive pattern to form a capacitor; the first conductive pattern is configured to transmit an electrical signal for the display region; the second conductive pattern is electrically connected to the first conductive semiconductor pattern through a plurality of via holes in the first peripheral region; and the first conductive semiconductor pattern, the first conductive pattern, and the second conductive pattern are at least in the first dam region and the interval region, and an arrangement density of the plurality of via holes in the interval region is smaller than an arrangement density of the plurality of via holes in the first dam region.

For example, the display substrate provided by at least one embodiment of the present disclosure further includes a first insulating layer and a second insulating layer; the first insulating layer is on a side of the first conductive semiconductor pattern away from the base substrate, the first conductive pattern is on a side of the first insulating layer away from the first conductive semiconductor pattern, the second insulating layer is on a side of the first conductive pattern away from the first insulating layer, and the second conductive pattern is on a side of the second insulating layer away from the first conductive pattern; and the plurality of via holes are at least in the first insulating layer and the second insulating layer and at least penetrate the first insulating layer and the second insulating layer.

For example, in the display substrate provided by at least one embodiment of the present disclosure, the arrangement density of the plurality of via holes in the interval region is 0.

For example, in the display substrate provided by at least one embodiment of the present disclosure, the first conductive semiconductor pattern and the second conductive pattern are further in the second dam region.

For example, in the display substrate provided by at least one embodiment of the present disclosure, the first conductive pattern is further in the second dam region.

For example, in the display substrate provided by at least one embodiment of the present disclosure, the arrangement density of the plurality of via holes in the interval region is smaller than an arrangement density of the plurality of via holes in the second dam region.

For example, in the display substrate provided by at least one embodiment of the present disclosure, in the interval region, an orthographic projection of the second conductive pattern on the base substrate overlaps with an orthographic projection of the second insulating layer on the base substrate, and an area of the orthographic projection of the second conductive pattern on the base substrate is equal to an area of the orthographic projection of the second insulating layer on the base substrate.

For example, the display substrate provided by at least one embodiment of the present disclosure further includes a first electrode layer; the first electrode layer is on a side of the second conductive pattern away from the base substrate and is electrically connected to the second conductive pattern; and in the interval region, the first electrode layer covers the second conductive pattern, and a surface of a side of the first electrode layer facing the base substrate is in contact with a surface of a side of the second conductive pattern away from the base substrate.

For example, the display substrate provided by at least one embodiment of the present disclosure further includes a first encapsulation layer; the first encapsulation layer is on a side of the first electrode layer away from the base substrate; and in the interval region, the first encapsulation layer covers the first electrode layer, and a surface of a side of the first encapsulation layer facing the base substrate is in contact with a surface of a side of the first electrode layer away from the base substrate.

For example, the display substrate provided by at least one embodiment of the present disclosure further includes a first dam structure and a second dam structure; the first dam structure is in the first dam region, and the second dam structure is in the second dam region; in the first dam region, the first dam structure is on a side of the first electrode layer away from the base substrate, and the first encapsulation layer is on a side of the first dam structure away from the first electrode layer and covers the first dam structure; and in the second dam region, the second dam structure is on a side of the second conductive pattern away from the base substrate, a portion of the second dam structure covers the first electrode layer, and the first encapsulation layer is on a side of the first electrode layer and the second dam structure away from the second conductive pattern and covers the first electrode layer and the second dam structure.

For example, in the display substrate provided by at least one embodiment of the present disclosure, a maximum distance between the base substrate and a surface of a side of a portion of the first encapsulation layer in the first dam region away from the base substrate is greater than a maximum distance between the base substrate and a surface of a side of a portion of the first encapsulation layer in the interval region away from the base substrate, and a maximum distance between the base substrate and a surface of a side of a portion of the first encapsulation layer in the second dam region away from the base substrate is greater than the maximum distance between the base substrate and the surface of the side of the portion of the first encapsulation layer in the interval region away from the base substrate.

For example, in the display substrate provided by at least one embodiment of the present disclosure, the maximum distance between the base substrate and the surface of the side of the portion of the first encapsulation layer in the first dam region away from the base substrate is greater than the maximum distance between the base substrate and the surface of the side of the portion of the first encapsulation layer in the second dam region away from the base substrate.

For example, the display substrate provided by at least one embodiment of the present disclosure further includes a third insulating layer, a fourth insulating layer, and a fifth insulating layer in the first peripheral region except for the interval region; the first dam structure includes a stack of the fourth insulating layer and the fifth insulating layer, and the second dam structure includes a stack of the third insulating layer, the fourth insulating layer, and the fifth insulating layer; in the first dam region, the fourth insulating layer is on a side of the first electrode layer away from the base substrate, and the fifth insulating layer is on a side of the fourth insulating layer away from the first electrode layer, the first encapsulation layer is on a side of the fifth insulating layer away from the fourth insulating layer, and covers a surface of a side of the fifth insulating layer away from the base substrate, a side surface of at least one side of the fifth insulating layer, and a side surface of at least one side of the fourth insulating layer; in the second dam region, the third insulating layer is on a side of the second conductive pattern away from the base substrate, the first electrode layer covers a portion of a surface of a side of the third insulating layer away from the base substrate and a side surface of a side of the third insulating layer close to the first dam region, the fourth insulating layer is on a side of the third insulating layer and the first electrode layer away from the second conductive pattern, and the fifth insulating layer is on a side of the fourth insulating layer away from the third insulating layer and the first electrode layer; and the first encapsulation layer is on a side of the fifth insulating layer away from the fourth insulating layer, and covers a surface of a side of the fifth insulating layer away from the base substrate, a side surface of at least one side of the fifth insulating layer, a side surface of at least one side of the fourth insulating layer, a portion of a surface of a side of the third insulating layer away from the base substrate, and a side surface of a side of the third insulating layer away from the first dam region.

For example, in the display substrate provided by at least one embodiment of the present disclosure, in the second dam region, the third insulating layer covers a portion of a surface of a side of the second conductive pattern away from the base substrate and a side surface of a side of the second conductive pattern away from the first dam region.

For example, the display substrate provided by at least one embodiment of the present disclosure further includes a second encapsulation layer, and the second encapsulation layer is on a side of the first encapsulation layer away from the first electrode layer and covers the first encapsulation layer.

For example, in the display substrate provided by at least one embodiment of the present disclosure, the first conductive pattern includes a plurality of first lines arranged side by side in a first direction, and the first conductive semiconductor pattern includes a plurality of second lines arranged side by side in a second direction, the first direction being different from the second direction.

For example, the display substrate provided by at least one embodiment of the present disclosure further includes a pixel structure in the display region; the pixel structure includes a pixel driving circuit on the base substrate, and the pixel driving circuit includes a thin film transistor and a storage capacitor; the thin film transistor includes a gate electrode, an active layer, a source electrode, and a drain electrode, and the storage capacitor includes a first capacitor electrode and a second capacitor electrode opposite to the first capacitor electrode; and the active layer and the first conductive semiconductor pattern are in an identical layer, the second capacitor electrode and the first conductive pattern are in an identical layer, and the source electrode, the drain electrode, and the second conductive pattern are in an identical layer.

For example, in the display substrate provided by at least one embodiment of the present disclosure, the first capacitor electrode and the gate electrode are in an identical layer.

For example, in the display substrate provided by at least one embodiment of the present disclosure, the pixel structure further includes a first planarization layer and a light-emitting element, the first planarization layer is on a side of the pixel driving circuit away from the base substrate to provide a first planarization surface and includes a first via hole, the light-emitting element is on the first planarization surface and is electrically connected to the pixel driving circuit through the first via hole, and in a case where the display substrate includes a third insulating layer, the third insulating layer and the first planarization layer are in an identical layer.

At least one embodiment of the present disclosure further provides a display substrate, and the display substrate includes a display region and a peripheral region around the display region; the display region includes an opening, and the peripheral region includes a first peripheral region at least partially around the opening; the first peripheral region includes a first dam region, a second dam region, and an interval region, the first dam region is at least partially around the opening, the interval region is at least partially around the first dam region, and the second dam region is at least partially around the interval region; the display substrate includes a base substrate, a first conductive semiconductor pattern, a first conductive pattern, and a second conductive pattern; the first conductive semiconductor pattern is on the base substrate, the first conductive pattern is on a side of the first conductive semiconductor pattern away from the base substrate, and is spaced apart and insulated from the first conductive semiconductor pattern to form a capacitor, and the second conductive pattern is on a side of the first conductive pattern away from the first conductive semiconductor pattern, and is spaced apart and insulated from the first conductive pattern to form a capacitor; the first conductive pattern is configured to transmit an electrical signal for the display region; the second conductive pattern is electrically connected to the first conductive semiconductor pattern through a plurality of via holes in the first peripheral region; and the first conductive semiconductor pattern, the first conductive pattern, and the second conductive pattern are at least in the second dam region and the interval region, and an arrangement density of the plurality of via holes in the interval region is smaller than an arrangement density of the plurality of via holes in the second dam region.

At least one embodiment of the present disclosure further provides a display device, and the display device includes the display substrate according to any one of the embodiments of the present disclosure.

At least one embodiment of the present disclosure further provides a manufacturing method of a display substrate, and the manufacturing method includes: providing a base substrate; forming a first conductive semiconductor pattern on the base substrate; forming a first conductive pattern on the first conductive semiconductor pattern, where the first conductive pattern is spaced apart and insulated from the first conductive semiconductor pattern to form a capacitor; and forming a second conductive pattern on the first conductive pattern, where the second conductive pattern is spaced apart and insulated from the first conductive pattern to form a capacitor; the display substrate includes a display region and a peripheral region around the display region, the display region includes an opening, and the peripheral region includes a first peripheral region at least partially around the opening; the first peripheral region includes a first dam region, a second dam region, and an interval region, the first dam region is at least partially around the opening, the interval region is at least partially around the first dam region, and the second dam region is at least partially around the interval region; the first conductive pattern is configured to transmit an electrical signal for the display region; the second conductive pattern is electrically connected to the first conductive semiconductor pattern through a plurality of via holes in the first peripheral region; and the first conductive semiconductor pattern, the first conductive pattern, and the second conductive pattern are at least in the first dam region and the interval region, and an arrangement density of the plurality of via holes in the interval region is smaller than an arrangement density of the plurality of via holes in the first dam region.

For example, in the manufacturing method of the display substrate provided by at least one embodiment of the present disclosure, forming the first conductive pattern on the first conductive semiconductor pattern includes: forming a first insulating layer on the first conductive semiconductor pattern, and forming the first conductive pattern on the first insulating layer; forming the second conductive pattern on the first conductive pattern includes: forming a second insulating layer on the first conductive pattern, and forming the second conductive pattern on the second insulating layer; and the plurality of via holes are at least in the first insulating layer and the second insulating layer and at least penetrate the first insulating layer and the second insulating layer.

For example, the manufacturing method of the display substrate provided by at least one embodiment of the present disclosure further includes: forming a first electrode layer on the second conductive pattern; the first electrode layer is electrically connected to the second conductive pattern; and in the interval region, the first electrode layer covers the second conductive pattern, and a surface of a side of the first electrode layer facing the base substrate is in contact with a surface of a side of the second conductive pattern away from the base substrate.

For example, the manufacturing method of the display substrate provided by at least one embodiment of the present disclosure further includes: forming a first encapsulation layer on the first electrode layer; and in the interval region, the first encapsulation layer covers the first electrode layer, and a surface of a side of the first encapsulation layer facing the base substrate is in contact with a surface of a side of the first electrode layer away from the base substrate.

For example, the manufacturing method of the display substrate provided by at least one embodiment of the present disclosure further includes: forming a pixel driving circuit of a pixel structure on the base substrate in the display region; the pixel driving circuit includes a thin film transistor and a storage capacitor, the thin film transistor includes a gate electrode, an active layer, a source electrode, and a drain electrode, and the storage capacitor includes a first capacitor electrode and a second capacitor electrode opposite to the first capacitor electrode; and the active layer and the first conductive semiconductor pattern are in an identical layer, the second capacitor electrode and the first conductive pattern are in an identical layer, and the source electrode, the drain electrode, and the second conductive pattern are in an identical layer.

For example, in the manufacturing method of the display substrate provided by at least one embodiment of the present disclosure, the first capacitor electrode and the gate electrode are in an identical layer.

BRIEF DESCRIPTION OF THE DRAWINGS

In order to clearly illustrate the technical solutions of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects.

In order to improve the packaging effect of the display component in the OLED display device, two dam structures with different heights are provided in the frame region surrounding the display region to block the penetration of moisture, oxygen, or the like into the interior of the display component, thereby avoiding adverse effects generated on various functional layers of the display component. In the related art, the height of the dam structure away from the display region is configured to be slightly greater than the height of the dam structure close to the display region, and organic film layers such as the pixel definition layer and the planarization layer between the two dam structures are removed entirely as much as possible to form a "trench" region, so that the encapsulation layer formed after packaging may effectively block the penetration of moisture, oxygen, or the like into the interior of the display component.

Currently, with the continuous popularization of electronic display products, the requirements of users for the function and appearance of the electronic display products are further improved. In order to satisfy different actual requirements of users, the appearance or display region of the electronic display product sometimes needs to be designed into irregular or special shapes.

Figure 1:
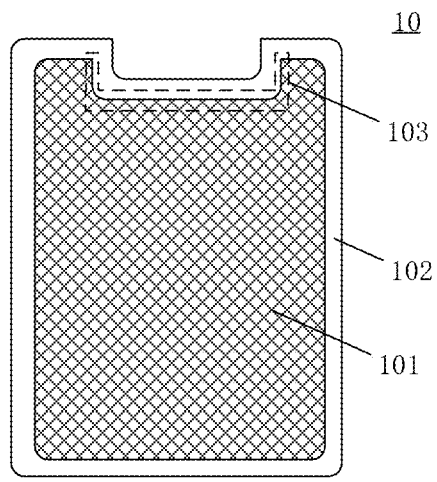
FIG. 1 is a planar diagram of an OLED display device.

FIG. 1 is a planar diagram of an OLED display device. For example, as illustrated in FIG. 1, the OLED display device 10 includes a display region 101 and a frame region 102 surrounding the display region 101. For example, the display region 101 is designed to have an irregular shape with a notch 103 on at least one side. Components such as a camera, a distance sensor, or the like may be provided in the region of the notch 103 of the display device 10, thereby facilitating achieving a narrow-frame display device.

For example, in order to avoid adverse effects generated on each functional layer of the display component in the display device 10, two dam structures with different heights may be provided in the frame region 102 surrounding the display region 101, and organic film layers such as the pixel definition layer and the planarization layer between the two dam structures are removed entirely as much as possible to form a "trench" region. Therefore, after packaging, the formed encapsulation layer may effectively block the penetration of moisture, oxygen, or the like into the interior of the display device 10.

Because the display region 101 has the notch 103, a plurality of metal lines are usually provided in the frame region 102 surrounding the notch 103 to electrically connect a plurality of rows of pixel units in the display region 101 on both sides of the notch 103 to provide, for example, scanning signals, for the plurality of rows of pixel units. Moreover, because the loads of the metal lines to transmit electrical signals are low, a plurality of signal compensation lines are usually designed below the metal lines, so that capacitors can be formed between the signal compensation lines and the metal lines, thereby increasing the transmission loads of the metal lines, compensating for the electrical signal transmission effects of the metal lines, and further avoiding display abnormalities of the pixel units in the display region 101 on both sides of the notch 103.

Generally, an auxiliary electrode (and other electrodes covering and contacting the auxiliary electrode) is provided in the frame region 102 to electrically connect the plurality of signal compensation lines to a power signal line providing, for example, a driving current signal or a driving voltage signal, so that the plurality of signal compensation lines receive the electrical signals required to form compensation capacitors. The auxiliary electrode is usually disposed above the plurality of signal compensation lines and the metal lines (that is, disposed on a side close to the encapsulation layer), and is electrically connected to the signal compensation lines through a plurality of via holes provided in the frame region 102. In this way, because of the requirement of the number of metal lines, in the frame region 102 surrounding the notch 103, some of the metal lines need to be disposed in the "trench" region, and accordingly, in order to compensate for the transmission loads of these metal lines, the signal compensation lines also need to extend to the "trench" region to form capacitors with the metal lines in the "trench" region, so that a plurality of via holes also need to be formed in the "trench" region to electrically connect the auxiliary electrode to the signal compensation lines.

However, because the organic film layers such as the pixel definition layer and the planarization layer between the two dam structures in the frame region 102 need to be removed as much as possible, the formed encapsulation layer may cover and directly contact the surface of the auxiliary electrode (or other electrodes covering the auxiliary electrode) in the "trench" region. The plurality of via holes provided between the auxiliary electrode and the signal compensation lines may cause a plurality of pits to be generated on the surface of the auxiliary electrode (or other electrodes covering the auxiliary electrode), resulting in the surface of the layer being in an up-and-down shape and becoming uneven. Furthermore, when packaging the "trench" region of the OLED display device 10, the surface of the encapsulation layer formed on the auxiliary electrode (or other electrodes covering the auxiliary electrode) may also be in an up-and-down shape accordingly, resulting in the surface of the encapsulation layer becoming uneven, so that the surface of the encapsulation layer is prone to cracks. The generated cracks are likely to spread continuously along the encapsulation layer and cause damage to the encapsulation layer, and the encapsulation layer may be unable or difficult to prevent moisture, oxygen, or the like from penetrating into the interior of the display component, thereby further resulting in corrosion or failure of the functional layers in the display component, and causing serious adverse effects on the performance of the display device, thereby greatly reducing the yield of the display device and shortening the service life of the display device.

At least one embodiment of the present disclosure provides a display substrate, and the display substrate includes a display region and a peripheral region around the display region. The display region includes an opening, and the peripheral region includes a first peripheral region at least partially around the opening. The first peripheral region includes a first dam region, a second dam region, and an interval region, the first dam region is at least partially around the opening, the interval region is at least partially around the first dam region, and the second dam region is at least partially around the interval region. The display substrate includes a base substrate, a first conductive semiconductor pattern, a first conductive pattern, and a second conductive pattern; the first conductive semiconductor pattern is on the base substrate; the first conductive pattern is on a side of the first conductive semiconductor pattern away from the base substrate, and is spaced apart and insulated from the first conductive semiconductor pattern to form a capacitor; the second conductive pattern is on a side of the first conductive pattern away from the first conductive semiconductor pattern, and is spaced apart and insulated from the first conductive pattern to form a capacitor; the first conductive pattern is configured to transmit an electrical signal for the display region; the second conductive pattern is electrically connected to the first conductive semiconductor pattern through a plurality of via holes in the first peripheral region; and the first conductive semiconductor pattern, the first conductive pattern, and the second conductive pattern are at least in the first dam region and the interval region, and an arrangement density of the plurality of via holes in the interval region is smaller than an arrangement density of the plurality of via holes in the first dam region, for example, a distance between adjacent via holes in the interval region being greater than a distance between adjacent via holes in the first dam region.

The display substrate provided by the above embodiments of the present disclosure reduces the arrangement density of the plurality of via holes, which electrically connect the second conductive pattern to the first conductive semiconductor pattern, in the interval region, and alleviates the up-and-down phenomenon caused by the via hole design on the surface of the second conductive pattern in the interval region, so that the surface of the second conductive pattern may be flatter, and further the surfaces of the first electrode layer and the encapsulation layer covering the second conductive pattern may be flatter, thereby reducing or avoiding cracks generated on the surface of the encapsulation layer. Thus, the display substrate provided by the above embodiments of the present disclosure may improve the uniformity and consistency of the prepared encapsulation layer and improve the packaging effect of the encapsulation layer on the display substrate, so as to effectively avoid penetration of moisture, oxygen, or the like into the interior of the display component to cause adverse effects such as corrosion or failure on the functional layers of the display component, thereby improving the performance and yield of the display substrate and extending the service life of the display substrate.

Hereinafter, some embodiments of the present disclosure are described in detail with reference to the accompanying drawings. It should be noted that the same reference numerals in different drawings are used to refer to the same described elements.

Figure 2A:
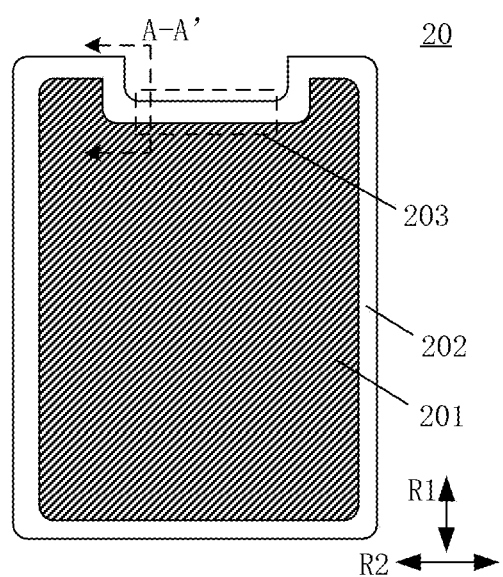
FIG. 2A is a schematic planar diagram of a display substrate provided by some embodiments of the present disclosure.
Figure 2B:
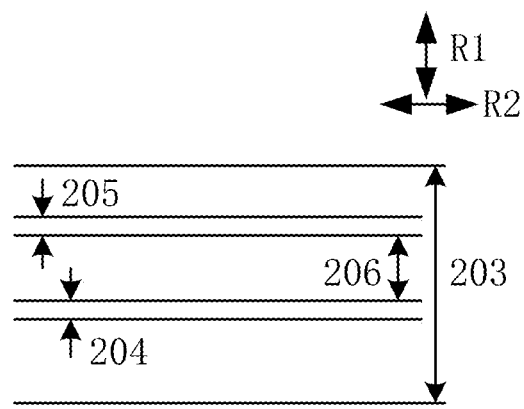
FIG. 2B is a schematic planar diagram of a first peripheral region of the display substrate illustrated in FIG. 2A.
Figure 2C:
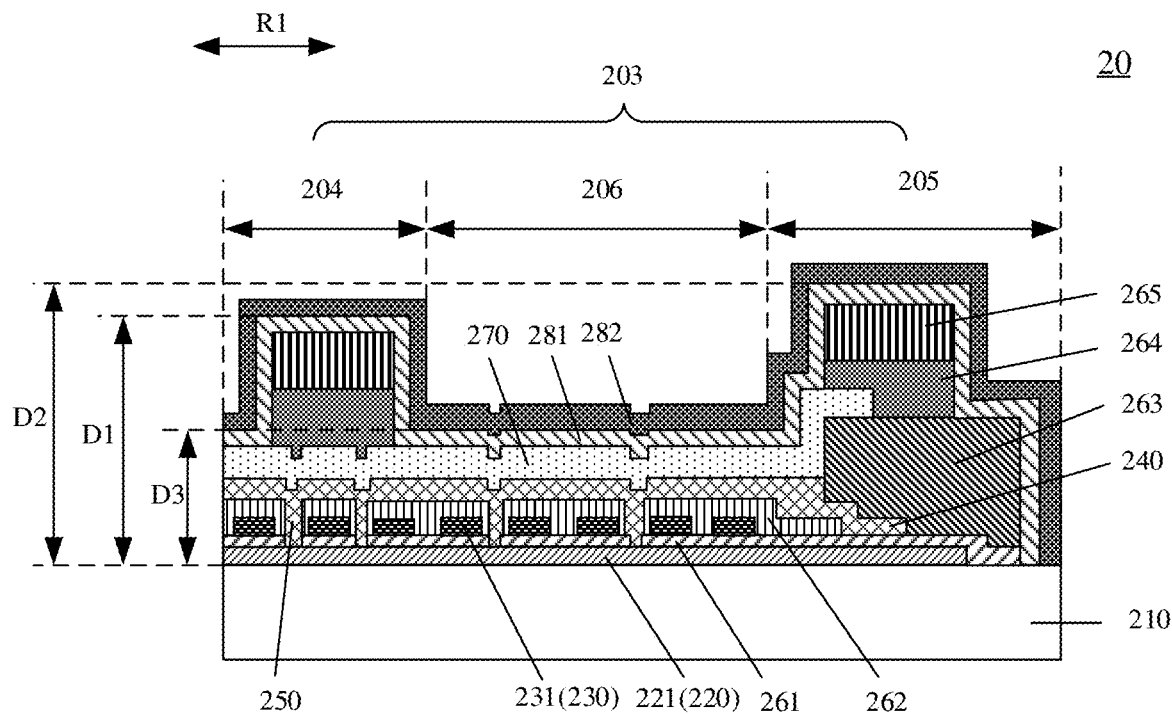
FIG. 2C is a schematic diagram of a partial cross-sectional structure of a display substrate provided by some embodiments of the present disclosure.

FIG. 2A is a schematic planar diagram of a display substrate provided by some embodiments of the present disclosure, FIG. 2B is a schematic planar diagram of a first peripheral region of the display substrate illustrated in FIG. 2A, and FIG. 2C is a schematic diagram of a partial cross-sectional structure of a display substrate provided by some embodiments of the present disclosure. For example, FIG. 2C is a schematic diagram of a cross-sectional structure of the display substrate illustrated in FIG. 2A along a line A-A'.

For example, as illustrated in FIG. 2A to FIG. 2C, the display substrate 20 includes a display region 201 and a peripheral region 202 around the display region 201. The display region 201 includes an opening, the opening may be a closed opening or an unclosed opening, and components such as a camera, a distance sensor, or the like may be provided in the region in which the opening is provided, thereby facilitating achieving a narrow-frame display device. For example, the opening may be a notch (an example of the unclosed opening) formed on at least one side of the display region 201 as illustrated in FIG. 2A. The peripheral region 202 includes a first peripheral region 203 at least partially around the opening. The first peripheral region 203 includes a first dam region 204, a second dam region 205, and an interval region 206. The first dam region 204 is at least partially around the opening, the interval region 206 is at least partially around the first dam region 204, and the second dam region 205 is at least partially around the interval region 206, so that the first dam region 204, the interval region 206, and the second dam region 205 are arranged from near to far relative to the opening.

The display substrate 20 includes a base substrate 210, a first conductive semiconductor pattern 220, a first conductive pattern 230, and a second conductive pattern 240. The first conductive semiconductor pattern 220 is located on the base substrate 210; the first conductive pattern 230 is located on a side of the first conductive semiconductor pattern 220 away from the base substrate 210, and is spaced apart and insulated from the first conductive semiconductor pattern 220 to form a capacitor; and the second conductive pattern 240 is located on a side of the first conductive pattern 230 away from the first conductive semiconductor pattern 220, and is spaced apart and insulated from the first conductive pattern 230 to form a capacitor. The first conductive pattern 230 is configured to transmit an electrical signal for the display region 201, and for example, the electrical signal may be one or more of a group consisting of a gate scanning signal, a light-emitting control signal, a reset signal, and the like for a pixel driving circuit in the display region 201. The second conductive pattern 240 is electrically connected to the first conductive semiconductor pattern 220 through a plurality of via holes 250 provided in the first peripheral region 203. The first conductive semiconductor pattern 220, the first conductive pattern 230, and the second conductive pattern 240 are located at least in the first dam region 204 and the interval region 206, and an arrangement density of the plurality of via holes 250 in the interval region 206 is smaller than an arrangement density of the plurality of via holes 250 in the first dam region 204.

In some embodiments, as illustrated in FIG. 2A and FIG. 2C, the first conductive pattern 230 includes a plurality of first lines 231 arranged side by side in a first direction R1, the first conductive semiconductor pattern 220 includes a plurality of second lines 221 arranged side by side in a second direction R2, and the first direction R1 is different from the second direction R2. For example, the first direction R1 may be perpendicular to the second direction R2, so that the plurality of first lines 231 and the plurality of second lines 221 are respectively arranged in a cross, and capacitors can be formed between the plurality of first lines 231 and the plurality of second lines 221, thereby improving the transmission loads of the plurality of first lines 231, compensating for the transmission effects of electrical signals on the plurality of first lines 231, and enabling the display effect of each part in the display region 201 to keep uniform and consistent.

In some embodiments, in the display substrate 20 illustrated in FIG. 2C, in the first dam region 204, a via hole 250 is provided between every two adjacent first lines 231. In the interval region 206, via holes are provided at intervals of two first lines 231, so that a distance between adjacent via holes 250 in the interval region 206 is greater than a distance between adjacent via holes 250 in the first dam region 204, and the arrangement density of the via holes 250 in the interval region 206 is smaller than the arrangement density of the via holes 250 in the first dam region 204.

In the above embodiments of the present disclosure, by reducing the arrangement density of the plurality of via holes 250 in the interval region 206, the up-and-down phenomenon of the surface of the second conductive pattern 240 in the interval region 206 caused by the via hole design may be alleviated, thereby allowing the surface of the second conductive pattern 240 to be flatter. Therefore, the surface of the side of the structural layer or functional layer (such as the first electrode layer 270 mentioned below) covering the second conductive pattern 240 away from the base substrate 210 may be flatter, and thus, when packaging the display component in the display substrate 20, the surface of the side of the formed encapsulation layer (such as the first encapsulation layer 281 mentioned below) away from the base substrate 210 may be flatter, thereby reducing or avoiding cracks generated on the surface of the encapsulation layer, and improving the uniformity and consistency of the formed encapsulation layer. Therefore, in the above embodiments, the packaging effect of the display substrate 20 may be significantly improved, and moisture, oxygen, or the like are effectively prevented from penetrating into the interior of the display component of the display substrate 20 to adversely affect the display component, thereby improving the performance and yield of the display substrate 20, and extending the service life of the display substrate 20.

It should be noted that, in the embodiments of the present disclosure illustrated in FIG. 2C, in the first dam region 204, one via hole 250 is provided between two adjacent first lines 231; and in the interval region 206, via holes are provided at intervals of two first lines 231. In some other embodiments of the present disclosure, in the first dam region 204, the via hole 250 may be provided between two adjacent first lines 231; and in the interval region 206, via holes are provided at intervals of three or more first lines 231. In some other embodiments of the present disclosure, in the first dam region 204, via holes 250 are provided at intervals of n (n is an integer greater than 1) first lines 231; and in the interval region 206, via holes 250 are provided at intervals of n+m (m is an integer greater than 0) first lines 231. That is, in the embodiments of the present disclosure, as long as the arrangement density of the plurality of via holes in the interval region is smaller than the arrangement density of the plurality of via holes in the first dam region, the embodiments of the present disclosure do not limit the specific arrangement and arrangement number of the via holes in the interval region and the first dam region.

It should be noted that, in the embodiments of the present disclosure illustrated in FIG. 2C, the specific number of the first lines 231 arranged in the first direction R1 in the first dam region 204 and the interval region 206 is exemplary. For example, in some other embodiments of the present disclosure, the number of the first lines 231 may be determined according to the number of rows of pixel units in the display region 201 on both sides of the opening or according to different actual needs. The number of the first lines 231 in the first dam region 204 and the interval region 206 may be determined according to, for example, the actual dimensions of the first dam region 204 and the interval region 206, and the setting requirements of the first lines 231 (for example, widths of the first lines 231, etc.), and the embodiments of the present disclosure are not limited in this aspect.

For example, in the embodiments of the present disclosure illustrated in FIG. 2C, widths of the first dam region 204, the interval region 206, and the second dam region 205 in the first direction R1 may all be set to about 40 μm, and for example, may be set within a range of 35 μm to 45 μm.

In some embodiments, as illustrated in FIG. 2C, the display substrate 20 further includes a first insulating layer 261 and a second insulating layer 262. The first insulating layer 261 is located on a side of the first conductive semiconductor pattern 220 away from the base substrate 210, the first conductive pattern 230 is located on a side of the first insulating layer 261 away from the first conductive semiconductor pattern 220, the second insulating layer 262 is located on a side of the first conductive pattern 230 away from the first insulating layer 261, and the second conductive pattern 240 is located on a side of the second insulating layer 262 away from the first conductive pattern 230. The plurality of via holes 250 are located at least in the first insulating layer 261 and the second insulating layer 262 and penetrate at least the first insulating layer 261 and the second insulating layer 262.

For example, the plurality of second lines 221 in the first conductive semiconductor pattern 220 and the plurality of first lines 231 in the first conductive pattern 230 use the first insulating layer 261 as a dielectric material to form capacitors, thereby improving the transmission loads of the plurality of first lines 231, and compensating for the transmission effects of the electrical signals on the plurality of first lines 231, so that the display effect of each part in the display region 201 of the display substrate 20 can be kept uniform and consistent.

In some embodiments, as illustrated in FIG. 2C, the display substrate 20 further includes a first electrode layer 270. The first electrode layer 270 is located on a side of the second conductive pattern 240 away from the base substrate 210 and is electrically connected to the second conductive pattern 240. In the interval region 206, the first electrode layer 270 covers the second conductive pattern 240, and the surface of the side of the first electrode layer 270 facing the base substrate 210 is in contact with the surface of the side of the second conductive pattern 240 away from the base substrate 210.

In some embodiments, as illustrated in FIG. 2C, the display substrate 20 further includes a first encapsulation layer 281. The first encapsulation layer 281 is located on a side of the first electrode layer 270 away from the base substrate 210. In the interval region 206, the first encapsulation layer 281 covers the first electrode layer 270, and the surface of the side of the first encapsulation layer 281 facing the base substrate 210 is in contact with the surface of the side of the first electrode layer 270 away from the base substrate 210.

In the above embodiments, by reducing the arrangement density of the plurality of via holes 250 in the interval region 206, the up-and-down phenomenon of the surface of the second conductive pattern 240 in the interval region 206 caused by the via hole design may be alleviated, so that the surface of the second conductive pattern 240 may be flatter, and further, the surface of the first electrode layer 270 covering the second conductive pattern 240 and the surface of the first encapsulation layer 281 covering the first electrode layer 270 may be flatter, thereby reducing or avoiding cracks generated on the surface of the first encapsulation layer 281. Therefore, the uniformity and consistency of the formed first encapsulation layer 281 may be improved, the packaging effect of the first encapsulation layer 281 on the display component of the display substrate 20 may be improved, and moisture, oxygen, or the like are effectively prevented from penetrating into the interior of the display component of the display substrate 20 to adversely affect the display component, thereby improving the performance and yield of the display substrate 20, and extending the service life of the display substrate 20.

In some embodiments, as illustrated in FIG. 2C, the display substrate 20 further includes a first dam structure and a second dam structure. The first dam structure is located in the first dam region 204, and the second dam structure is located in the second dam region 205. In the first dam region 204, the first dam structure is located on a side of the first electrode layer 270 away from the base substrate 210, and the first encapsulation layer 281 is located on a side of the first dam structure away from the first electrode layer 270 and covers the first dam structure. In the second dam region 205, the second dam structure is located on a side of the second conductive pattern 240 away from the base substrate 210, a portion of the second dam structure covers the first electrode layer 270, and the first encapsulation layer 281 is located on a side of the first electrode layer 270 and the second dam structure away from the second conductive pattern 240 and covers the first electrode layer 270 and the second dam structure.

In some embodiments, as illustrated in FIG. 2C, a maximum distance D1 between a surface of a side of a portion of the first encapsulation layer 281 in the first dam region 204 away from the base substrate 210, and the base substrate 210 is greater than a maximum distance D3 between a surface of a side of a portion of the first encapsulation layer 281 in the interval region 206 away from the base substrate 210, and the base substrate 210. A maximum distance D2 between a surface of a side of a portion of the first encapsulation layer 281 in the second dam region 205 away from the base substrate 210, and the base substrate 210 is greater than the maximum distance D3 between a surface of a side of a portion of the first encapsulation layer 281 in the interval region 206 away from the base substrate 210, and the base substrate 210. Therefore, after organic film layers such as the pixel definition layer and the planarization layer in the interval region 206 of the display substrate 20 are removed, the "trench" region is formed by the first dam structure and the second dam structure in the first peripheral region 203, so that after packaging, the penetration of moisture, oxygen, or the like into the interior of the display component of the display substrate 20 can be effectively prevented, thereby avoiding adverse effects on the functional layers or structural layers of the display component.

In some embodiments, as illustrated in FIG. 2C, the maximum distance D1 between a surface of a side of a portion of the first encapsulation layer 281 in the first dam region 204 away from the base substrate 210, and the base substrate 210 is smaller than the maximum distance D2 between a surface of a side of a portion of the first encapsulation layer 281 in the second dam region 205 away from the base substrate 210, and the base substrate 210. Thus, the first dam structure and the second dam structure have different heights from the base substrate 210, and the penetration of moisture, oxygen, or the like into the interior of display component of the display substrate 20 after packaging may be more effectively prevented, thereby further avoiding adverse effects on the various functional layers or structural layers of the display component.

In some embodiments, as illustrated in FIG. 2C, the display substrate 20 further includes a third insulating layer 263, a fourth insulating layer 264, and a fifth insulating layer 265 in the first peripheral region 203 except for the interval region 206. The first dam structure includes a stack of the fourth insulating layer 264 and the fifth insulating layer 265, and the second dam structure includes a stack of the third insulating layer 263, the fourth insulating layer 264, and the fifth insulating layer 265.

In the first dam region 204, the fourth insulating layer 264 is located on a side of the first electrode layer 270 away from the base substrate 210, the fifth insulating layer 265 is located on a side of the fourth insulating layer 264 away from the first electrode layer 270, and the first encapsulation layer 281 is located on a side of the fifth insulating layer 265 away from the fourth insulating layer 264 and covers a surface of a side of the fifth insulating layer 265 away from the base substrate 210, a side surface of at least one side of the fifth insulating layer 265, and a side surface of at least one side of the fourth insulating layer 264.

In the second dam region 205, the third insulating layer 263 is located on a side of the second conductive pattern 240 away from the base substrate 210, the first electrode layer 270 covers a portion of a surface of a side of the third insulating layer 263 away from the base substrate 210 and a side surface of a side of the third insulating layer 263 close to the first dam region 204, the fourth insulating layer 264 is located on a side of the third insulating layer 263 and the first electrode layer 270 away from the second conductive pattern 240, the fifth insulating layer 265 is located on a side of the fourth insulating layer 264 away from the third insulating layer 263 and the first electrode layer 270, and the first encapsulation layer 281 is located on a side of the fifth insulating layer 265 away from the fourth insulating layer 264 and covers a surface of a side of the fifth insulating layer 265 away from the base substrate 210, a side surface of at least one side of the fifth insulating layer 265, a side surface of at least one side of the fourth insulating layer 264, a portion of a surface of a side of the third insulating layer 263 away from the base substrate 210, and a side surface of a side of the third insulating layer 263 away from the first dam region 204.

In some embodiments, as illustrated in FIG. 2C, in the second dam region 205, the third insulating layer 263 covers a portion of a surface of a side of the second conductive pattern 240 away from the base substrate 210 and a side surface of a side of the second conductive pattern 240 away from the first dam region 204.

In some embodiments, as illustrated in FIG. 2C, the display substrate 20 further includes a second encapsulation layer 282. The second encapsulation layer 282 is located on a side of the first encapsulation layer 281 away from the first electrode layer 270 and covers the first encapsulation layer 281. For example, both the first encapsulation layer 281 and the second encapsulation layer 282 may be organic encapsulation layers, and the stacked arrangement of the first encapsulation layer 281 and the second encapsulation layer 282 may further increase difficulty for moisture, oxygen, or the like to penetrate into the interior of the display component of the display substrate 20.

It should be noted that, in the embodiments of the present disclosure illustrated in FIG. 2C, only the first insulating layer 261 is provided between the first conductive semiconductor pattern 220 and the first conductive pattern 230, and only the second insulating layer 262 is provided between the first conductive pattern 230 and the second conductive pattern 240. In some other embodiments of the present disclosure, there may be other insulating layers or other structural or functional layers provided between the first conductive semiconductor pattern 220 and the first conductive pattern 230 in addition to the first insulating layer 261, and similarly, there may be other insulating layers or other structural or functional layers provided between the first conductive pattern 230 and the second conductive pattern 240 in addition to the second insulating layer 262, as long as the first conductive semiconductor pattern 220 can be electrically connected to the second conductive pattern 240 through via holes through the corresponding insulating layers to allow compensation capacitors to be formed between the first conductive pattern 230 and the first conductive semiconductor pattern 220. The embodiments of the present disclosure are not limited in this aspect.

It should be noted that, in some other embodiments of the present disclosure, the display substrate may further include other structures or functional layers in the first peripheral region in addition to the first conductive semiconductor pattern, the first conductive pattern, the second conductive pattern, the first insulating layer, the second insulating layer, and the like illustrated in FIG. 2C, as long as capacitors can be formed between the first conductive pattern and the first conductive semiconductor pattern to achieve the compensation effect. The embodiments of the present disclosure are not limited in this aspect.

Figure 3:
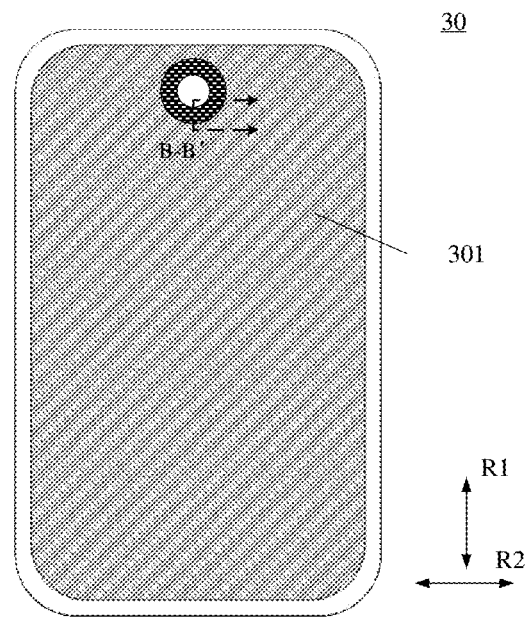
FIG. 3 is a schematic planar diagram of another display substrate provided by some embodiments of the present disclosure.

It should be noted that the cross-sectional structure illustrated in FIG. 2C may be a cross-sectional structure of the display substrate 20 illustrated in FIG. 2A along the line; or in some other embodiments of the present disclosure, the cross-sectional structure illustrated in FIG. 2C may be, for example, a cross-sectional structure of the display substrate 30 (including the display region 301) illustrated in FIG. 3 along the line B-B', and the opening of the display substrate 30 illustrated in FIG. 3 is closed. That is, the embodiments of the present disclosure do not limit the specific shape, position, or the like of the opening of the display region of the display substrate.

It should be noted that the embodiments of the present disclosure do not limit the shape or contour of the display substrate. For example, the display substrate of the embodiments of the present disclosure may be in a square shape as illustrated in FIG. 2A or FIG. 3, or may also be in other suitable regular shapes, such as a round shape, a regular hexagon shape, a regular octagon shape, etc., or in irregular shapes. The embodiments of the present disclosure are not limited in this aspect.

In some embodiments, the base substrate 210 may be a glass substrate, a quartz substrate, a metal substrate, a resin substrate, or the like. For example, the material of the base substrate 210 may include an organic material, and for example, the organic material may be a resin material, such as polyimide, polycarbonate, polyacrylate, polyetherimide, polyether-sulfone, polyethylene terephthalate, polyethylene naphthalene dicarboxylate, or the like. For example, the base substrate 210 may be a flexible substrate or a non-flexible substrate, and the embodiments of the present disclosure are not limited in this aspect.

In some embodiments, materials of the first insulating layer 261, the second insulating layer 262, the third insulating layer 263, the fourth insulating layer 264, and the fifth insulating layer 265 may include inorganic insulating materials, such as silicon oxide, silicon nitride, silicon oxynitride, etc., or may include organic insulating materials, such as polyimide, poly-phthalimide, polyamide, acrylic resin, benzo-cyclobutene, or phenolic resin. The embodiments of the present disclosure do not specifically limit the materials of the first insulating layer, the second insulating layer, the third insulating layer, the fourth insulating layer, and the fifth insulating layer. For example, the materials of the first insulating layer, the second insulating layer, the third insulating layer, the fourth insulating layer, and the fifth insulating layer may be the same or partially the same as each other, or may be different from each other, and the embodiments of the present disclosure are not limited in this aspect.

In some embodiments, the materials of the plurality of second lines 221 of the first conductive semiconductor pattern 220 may include a polysilicon semiconductor or an oxide semiconductor (for example, indium gallium zinc oxide).

In some embodiments, the materials of the plurality of first lines 231 of the first conductive pattern 230 may include a metal material or an alloy material, and for example, may be a metal single-layer structure or a metal multi-layer structure formed by molybdenum, aluminum, titanium, or the like.

In some embodiments, the material of the second conductive pattern 240 may include a metal material or an alloy material, and for example, may be a metal single-layer structure or a metal multi-layer structure formed by molybdenum, aluminum, titanium, etc. For example, the multi-layer structure is a stacked layer of a plurality of metal layers (such as a stacked layer of three metal layers of aluminum, titanium, and aluminum (Al/Ti/Al)).

In some embodiments, the material of the first electrode layer 270 may include at least one conductive oxide material, which may include indium tin oxide (ITO), indium zinc oxide (IZO), zinc oxide (ZnO), etc., or may further include a metal with high reflectivity as a reflection layer, such as silver (Ag).

In some embodiments, the materials of the first encapsulation layer 281 and the second encapsulation layer 282 may include insulating materials, such as silicon nitride, silicon oxide, silicon oxynitride, etc. The inorganic insulating materials such as silicon nitride, silicon oxide, silicon oxynitride, and the like have high density, which can prevent the intrusion of moisture, oxygen, or the like.

For example, in some embodiments of the present disclosure, the arrangement density of the plurality of via holes in the interval region may be set to 0, that is, there is no via hole provided in the interval region. Therefore, the up-and-down phenomenon of the surface of the second conductive pattern in the interval region caused by the via hole design may be eliminated or further alleviated, so that the surface of the second conductive pattern may be kept uniform and flat. Thus, the surface of the first electrode layer covering the second conductive pattern and the surface of the first encapsulation layer covering the first electrode layer may also be kept uniform and flat, thereby avoiding or greatly reducing cracks generated on the surface of the first encapsulation layer, further improving the uniformity and consistency of the first encapsulation layer, and improving the packaging effect of the first encapsulation layer on the display substrate. Further, the surface of the second encapsulation layer covering the first encapsulation layer may also be kept uniform and flat, so as to avoid or greatly reduce cracks generated on the surface of the second encapsulation layer, thereby improving the uniformity and consistency of the second encapsulation layer, and improving the packaging effect of the second encapsulation layer on the display substrate.

Figure 4:
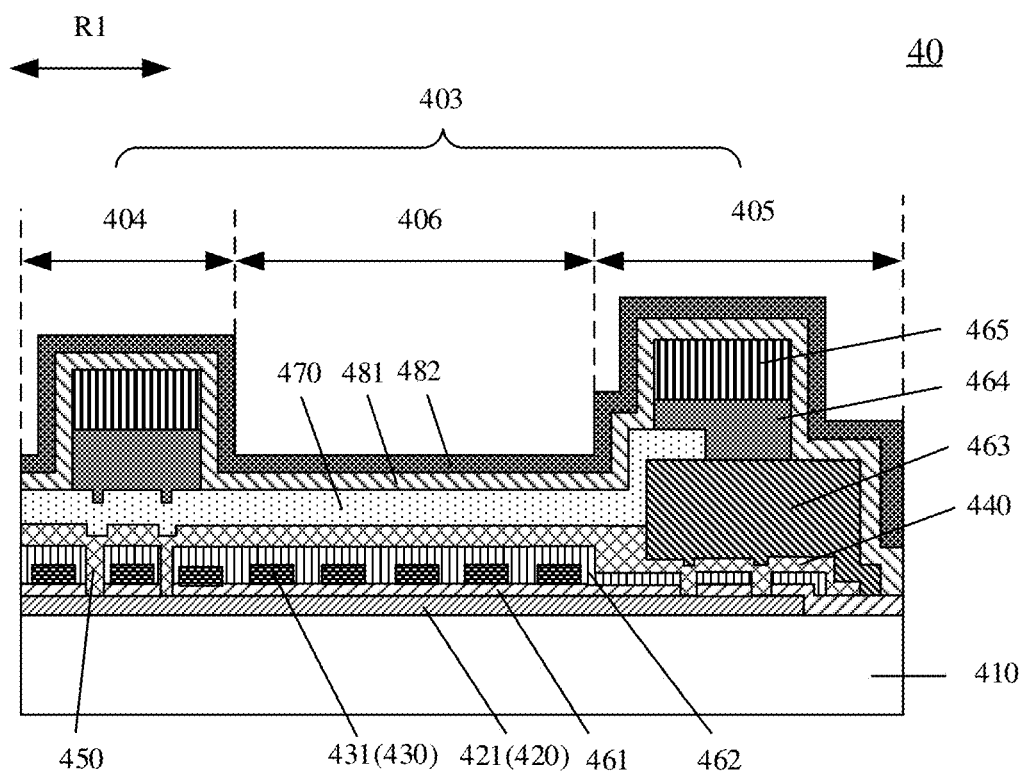
FIG. 4 is a schematic diagram of a partial cross-sectional structure of another display substrate provided by some embodiments of the present disclosure.

FIG. 4 is a schematic diagram of a partial cross-sectional structure of another display substrate provided by some embodiments of the present disclosure. For example, FIG. 4 may also be a schematic diagram of a cross-sectional structure of the display substrate illustrated in FIG. 2A along the line A-A', or a schematic diagram of a cross-sectional structure of the display substrate illustrated in FIG. 3 along the line B-B'. For example, structures of the display substrate 40 illustrated in FIG. 4 are substantially the same as or similar to those of the display substrate 20 illustrated in FIG. 2C except for the first conductive semiconductor pattern 420, the second conductive pattern 440, and the via holes 450, and the same or similar structures are not described again.

In some embodiments, as illustrated in FIG. 4, the first conductive semiconductor pattern 420, the second conductive pattern 440 and the plurality of via holes 450 are located in the first dam region 404, the interval region 406, and the second dam region 405. Thus, by providing the via holes 450, which can electrically connect the first conductive semiconductor pattern 420 and the second conductive pattern 440, in both the first dam region 404 and the second dam region 405, the electrical connection effect between the first conductive semiconductor pattern 420 and the second conductive pattern 440 can be further improved.

In some embodiments, as illustrated in FIG. 4, the arrangement density of the plurality of via holes 450 in the interval region 406 is set to 0, that is, in the case of ensuring the electrical connection effect between the first conductive semiconductor pattern 420 and the second conductive pattern 440, there may be no via hole 450 provided in the interval region 406 of the display substrate 40, so that the up-and-down phenomenon on the surface of the second conductive pattern 440 in the interval region 406 caused by the via hole design may be eliminated or further alleviated, and the surface of the second conductive pattern 440 may be kept uniform and flat. Thus, the surface of the first electrode layer 470 covering the second conductive pattern 440 and the surface of the first encapsulation layer 481 covering the first electrode layer 470 may also be kept uniform and flat, thereby avoiding or greatly reducing cracks generated on the surface of the first encapsulation layer 481, further improving the uniformity and consistency of the first encapsulation layer 481, and improving the packaging effect of the first encapsulation layer 481 on the display substrate 40. Further, the surface of the second encapsulation layer 482 covering the first encapsulation layer 481 may also be kept uniform and flat, so as to avoid or greatly reduce cracks generated on the surface of the second encapsulation layer 482, thereby improving the uniformity and consistency of the second encapsulation layer 482, and improving the packaging effect of the second encapsulation layer 482 on the display substrate 40.

For example, in the embodiments of the present disclosure illustrated in FIG. 4, the arrangement density of the plurality of via holes 450 in the first dam region 404 is the same as the arrangement density of the plurality of via holes 450 in the second dam region 405. In some other embodiments of the present disclosure, the arrangement density of the plurality of via holes in the first dam region may also be different from the arrangement density of the plurality of via holes in the second dam region, and the embodiments of the present disclosure are not limited in this aspect.

Figure 5:
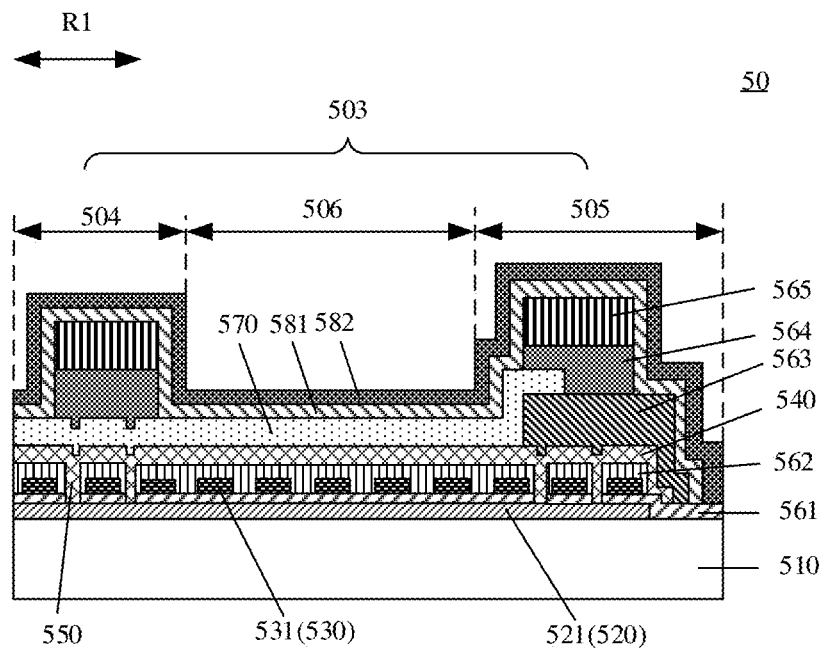
FIG. 5 is a schematic diagram of a partial cross-sectional structure of still another display substrate provided by some embodiments of the present disclosure.

FIG. 5 is a schematic diagram of a partial cross-sectional structure of still another display substrate provided by some embodiments of the present disclosure. For example, FIG. 5 may also be a schematic diagram of a cross-sectional structure of the display substrate illustrated in FIG. 2A along the line A-A', or a schematic diagram of a cross-sectional structure of the display substrate illustrated in FIG. 3 along the line B-B'. For example, structures of the display substrate 50 illustrated in FIG. 5 are substantially the same as or similar to those of the display substrate 20 illustrated in FIG. 2C except for the first conductive semiconductor pattern 520, the first conductive pattern 530, the second conductive pattern 540, and the via holes 550, or structures of the display substrate 50 illustrated in FIG. 5 are substantially the same as or similar to those of the display substrate 40 illustrated in FIG. 4 except for the first conductive pattern 530, and the same or similar structures are not described again.

In some embodiments, as illustrated in FIG. 5, compared to the display substrate 40 illustrated in FIG. 4, the first conductive pattern 530 is further located in the second dam region 505. That is, the first conductive semiconductor pattern 520, the first conductive pattern 530, the second conductive pattern 540, and the plurality of via holes 550 are all located at least in the first dam region 504, the second dam region 505, and the interval region 506.

In some embodiments, as illustrated in FIG. 5, the arrangement density of the plurality of via holes 550 in the interval region 506 is set to 0. Therefore, in the case of ensuring the electrical connection effect between the first conductive semiconductor pattern 520 and the second conductive pattern 540, there is no via hole 550 provided in the interval region 506 of the display substrate 50, so that the up-and-down phenomenon on the surface of the second conductive pattern 540 in the interval region 506 caused by the via hole design may be eliminated or further alleviated, and the surface of the second conductive pattern 540 may be kept uniform and flat. Further, the surface of the first electrode layer 570 covering the second conductive pattern 540 and the surface of the first encapsulation layer 581 covering the first electrode layer 570 may also be kept uniform and flat, thereby avoiding or greatly reducing cracks generated on the surface of the first encapsulation layer 581, further improving the uniformity and consistency of the first encapsulation layer 581, and improving the packaging effect of the first encapsulation layer 581 on the display substrate 50.

For example, in the embodiments of the present disclosure illustrated in FIG. 5, the arrangement density of the via holes 550 in the first dam region 504 is the same as the arrangement density of the via holes 550 in the second dam region 505. In some other embodiments of the present disclosure, the arrangement density of the via holes in the first dam region may also be different from the arrangement density of the via holes in the second dam region. For example, the arrangement density of the via holes in the first dam region may be greater than the arrangement density of the via holes in the second dam region, and the arrangement density of the via holes in the second dam region is greater than the arrangement density of the via holes in the interval region. Alternatively, the arrangement density of the via holes in the second dam region may also be greater than the arrangement density of the via holes in the first dam region, and the arrangement density of the via holes in the first dam region is greater than the arrangement density of the via holes in the interval region. The embodiments of the present disclosure are not limited in this aspect.

In some other embodiments of the present disclosure, in the case where the arrangement density of the via holes in the first dam region is greater than the arrangement density of the via holes in the interval region, the arrangement density of the via holes in the second dam region may be the same as the arrangement density of the via holes in the interval region, and for example, the arrangement density of the via holes in the second dam region and the arrangement density of the via holes in the interval region may be set to 0. Alternatively, in some other embodiments of the present disclosure, in the case where the arrangement density of the via holes in the second dam region is greater than the arrangement density of the via holes in the interval region, the arrangement density of via holes in the first dam region may be the same as the arrangement density of the via holes in the interval region, and for example, the arrangement density of the via holes in the first dam region and the arrangement density of the via holes in the interval region may be set to 0. The embodiments of the present disclosure are not limited in this aspect.

For example, in some other embodiments of the present disclosure, in the case where the first conductive semiconductor pattern is electrically connected to the second conductive pattern through via holes provided in the first dam region and the second dam region, the interval region may also be provided with the via hole according to actual needs, as long as the arrangement density of the via holes provided in the interval region is smaller than the arrangement density of the via holes provided in the first dam region and the arrangement density of the via holes provided in the second dam region. The embodiments of the present disclosure are not limited in this aspect.

Figure 6A:
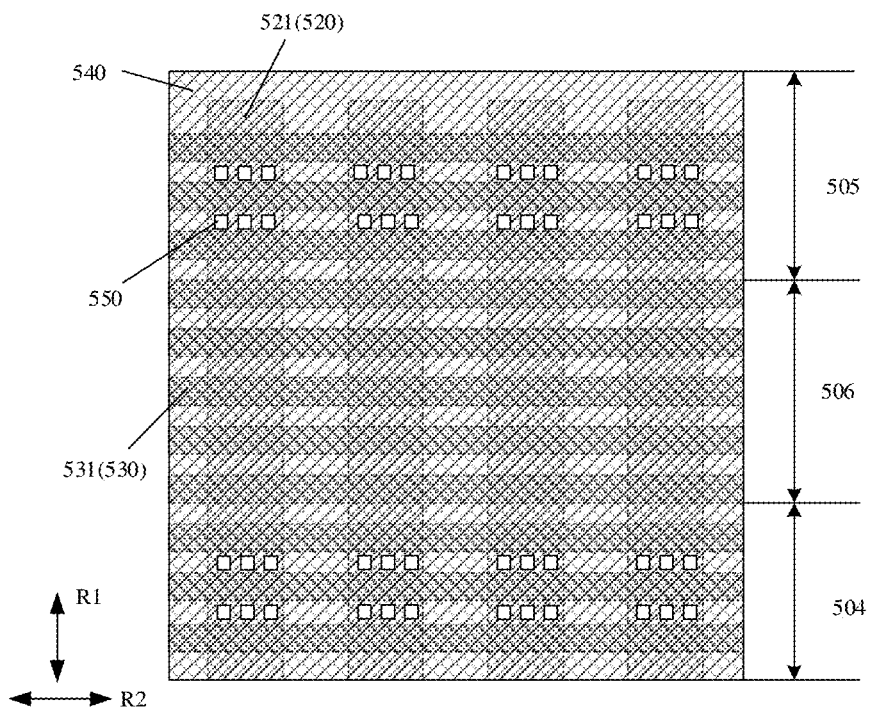
FIG. 6A and FIG. 6B are schematic diagrams of arrangement of a plurality of via holes in a first peripheral region provided by some embodiments of the present disclosure.
Figure 6B:
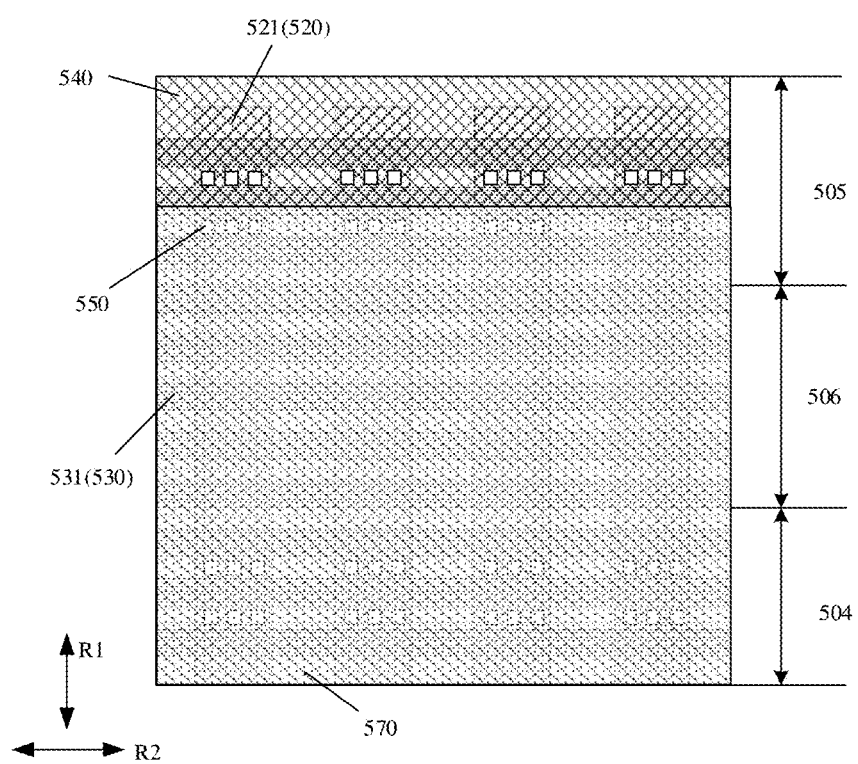

FIG. 6A and FIG. 6B are schematic diagrams of arrangement of a plurality of via holes in a first peripheral region provided by some embodiments of the present disclosure. For example, FIG. 6A and FIG. 6B may be schematic diagrams of the arrangement of the plurality of via holes 550 in the first peripheral region 503 of the display substrate 50 illustrated in FIG. 5. It should be noted that, in order to facilitate description, FIG. 6A only illustrates the arrangement relationship of the first conductive semiconductor pattern 520, the first conductive pattern 530, and the second conductive pattern 540, and FIG. 6B illustrates the arrangement relationship of the first conductive semiconductor pattern 520, the first conductive pattern 530, the second conductive pattern 540, and the first electrode layer 570. The design of other structures or functional layers in the display substrate 50 may be with reference to the conventional arrangements in the art, and details are not described herein again.

For example, taking the display substrate 50 illustrated in FIG. 5 as an example, FIG. 6A illustrates the position relationship of the first conductive semiconductor pattern 520, the first conductive pattern 530, and the second conductive pattern 540 in a plane parallel to the surface of the base substrate 510 and illustrates the arrangement of the plurality of via holes 550, and FIG. 6B illustrates the position relationship of the first conductive semiconductor pattern 520, the first conductive pattern 530, the second conductive pattern 540, and the first electrode layer 570 in a plane parallel to the surface of the base substrate 510 and illustrates the arrangement of the plurality of via holes 550.

In some embodiments, as illustrated in FIG. 6A and FIG. 6B, the first conductive semiconductor pattern 520 includes a plurality of second lines 521 arranged in the second direction R2, the first conductive pattern 530 includes a plurality of first lines 531 arranged in the first direction R1, and the first direction R1 is perpendicular to the second direction R2.

For example, the plurality of first lines 531 are arranged at intervals along the first direction R1, and each first line 531 partially overlaps with the plurality of second lines 521. The plurality of second lines 521 are arranged at intervals along the second direction R2, and each second line 521 partially overlaps with the plurality of first lines 531. For example, the via holes 550 may be provided in portions where the second line 521 does not overlap with the first line 531, that is, provided in intervals between two adjacent first lines 531.

For example, the first electrode layer 570 covers the via holes 550 provided in the first dam region 504 and at least covers some of the via holes 550 provided in the second dam region 505.

For example, in the first dam region 504 and the interval region 506, the first electrode layer 570 covers the plurality of first lines 531 and the plurality of second lines 521. In the second dam region 505, the first electrode layer 570 covers some of the plurality of first lines 531 and covers a portion of each of the plurality of second lines 521, respectively.

It should be noted that, in the embodiments illustrated in FIG. 6A and FIG. 6B, the plurality of first lines 531 adopt the same material, and in some other embodiments of the present disclosure, the plurality of first lines 531 may be formed alternately adopting different materials, which is not limited in the embodiments of the present disclosure.

The plurality of first lines 531 may be formed in the same layer as a certain structure of a pixel structure in the display region. The plurality of first lines 531 may also be formed in the same layer as two structures of the pixel structure in the display region, that is, some first lines are formed in the same layer as one structure of the pixel structure, and the other first lines are formed in the same layer as another structure of the pixel structure. In some embodiments, these first lines are alternately arranged to form the plurality of first lines 531. The plurality of first lines 531 may also be formed in the same layer as three structures of the pixel structure in the display region, that is, a first part of the first lines are formed in the same layer as a first structure of the pixel structure, a second part of the first lines are formed in the same layer as a second structure of the pixel structure, and a third part of the first lines are formed in the same layer as a third structure of the pixel structure. In some embodiments, each of the three parts of first lines has one line, three lines are arranged in sequence as a group, and a plurality of groups are arranged to form the plurality of first lines 531. In some other embodiments, each of the three parts of first lines is as a group, and three groups are arranged to form the plurality of first lines 531.

It should be noted that, in the second direction R2, the number of via holes 550 formed on each second line 521 is only an exemplary description. In some other embodiments of the present disclosure, in the second direction R2, the number of via holes formed on each second line may be determined according to factors such as the width of the second line in the second direction R2, the accuracy of the manufacturing process, etc., and the embodiments of the present disclosure are not limited in this aspect.

For example, in some embodiments of the present disclosure, in the interval region, an orthographic projection of the second conductive pattern on the base substrate overlaps with an orthographic projection of the second insulating layer on the base substrate, and an area of the orthographic projection of the second conductive pattern on the base substrate is equal to an area of the orthographic projection of the second insulating layer on the base substrate.

For example, taking the display substrate 50 illustrated in FIG. 5 as an example, the second conductive pattern 540 may be provided in a whole piece in the interval region 506, and the second insulating layer 562 may also be provided in a whole piece in the interval region 506. Therefore, in the case where there is no via hole 550 provided in the interval region 506, in the interval region 506, the orthographic projection of the second conductive pattern 540 on the base substrate 510 coincides with the orthographic projection of the second insulating layer 562 on the base substrate 510, and the area of the orthographic projection of the second conductive pattern 540 on the base substrate 510 is equal to the area of the orthographic projection of the second insulating layer 562 on the base substrate 510.

For example, in some embodiments of the present disclosure, the display substrate further includes a pixel structure in the display region. The pixel structure includes a pixel driving circuit on the base substrate, and the pixel driving circuit includes a thin film transistor and a storage capacitor. The thin film transistor includes a gate electrode, an active layer, a source electrode, and a drain electrode, and the storage capacitor includes a first capacitor electrode and a second capacitor electrode opposite to the first capacitor electrode. The active layer and the first conductive semiconductor pattern are disposed in an identical layer, the gate electrode and the first capacitor electrode are disposed in an identical layer, the second capacitor electrode and the first conductive pattern are disposed in an identical layer, and the source electrode, the drain electrode, and the second conductive pattern are disposed in an identical layer. Therefore, the manufacturing process of the display substrate may be simplified, and the manufacturing cost of the display substrate may be reduced.

It should be noted that, "disposed in an identical layer" means that two functional or structural layers are formed by the same material in the same layer in the layer structure of the display substrate, that is, in the manufacturing process, the two functional or structural layers can be formed through the same material layer, and can be formed by the same patterning process to form the required patterns and structures, for example, the material layer may be formed first, and the required patterns and structures may be formed by performing the patterning process on the material layer.

It should be noted that, in some other embodiments of the present disclosure, the first conductive pattern may also be disposed in the same layer as the gate electrode and the first capacitor electrode. In other embodiments of the present disclosure, a part of the first conductive pattern is disposed in the same layer as the second capacitor electrode, and the other part of the first conductive pattern is disposed in the same layer as the gate electrode and the first capacitor electrode, that is, the first conductive pattern includes two parts formed alternately, which is not limited in the embodiments of the present disclosure.

The display region of the display substrate provided by the embodiments of the present disclosure is described below by taking the cross-sectional structure of the display substrate 50 in the first peripheral region 503 illustrated in FIG. 5 as an example.

Figure 7:
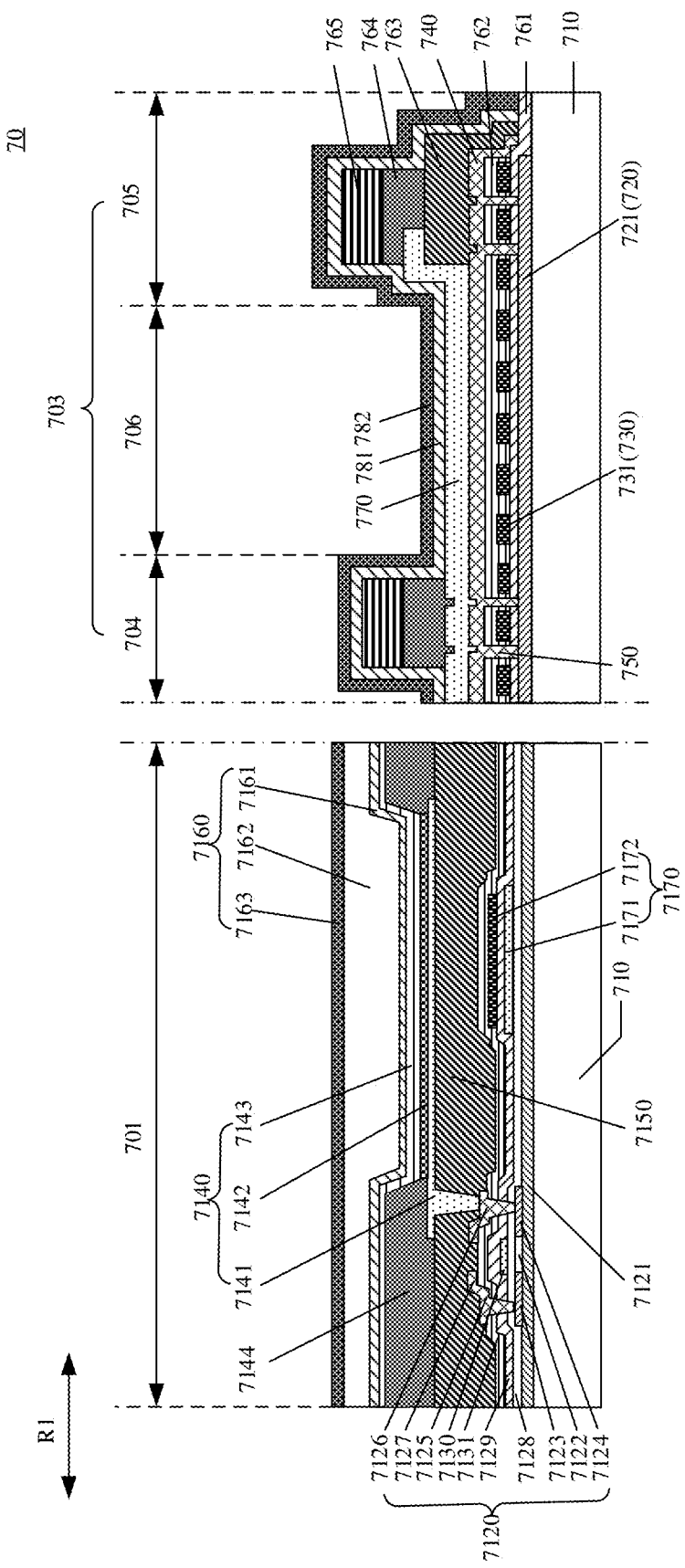
FIG. 7 is a schematic diagram of a partial cross-sectional structure of further still another display substrate provided by some embodiments of the present disclosure.

FIG. 7 is a schematic diagram of a partial cross-sectional structure of further still another display substrate provided by some embodiments of the present disclosure. For example, the portion of the first peripheral region 703 of the display substrate 70 illustrated in FIG. 7 is substantially the same as or similar to the portion of the first peripheral region 503 of the display substrate 50 illustrated in FIG. 5, and details are not described herein again.

For example, as illustrated in FIG. 7, the display substrate 70 further includes a pixel structure located in the display region 701 for implementing functions such as light emission driving, control, etc. The pixel structure includes a pixel driving circuit 7120, a first planarization layer 7150, and a light-emitting element 7140 on a base substrate 710.

For example, the pixel driving circuits 7120 in the plurality of rows of pixel units in the display region 701 on the left side and right side of the opening may be electrically connected through the first conductive pattern 730 (for example, the plurality of first lines 731 in the first conductive pattern 730), so as to transmit, for example, one or more electrical signals selecting from a group consisting of gate scanning signals, light-emitting control signals, reset signals, and the like for the pixel driving circuits 7120.

For example, one first line 731 may be provided for each row of pixel driving circuits 7120 located in the display region 701 on the left side and right side of the opening to transmit one of the above electrical signals, and for example, gate lines of each row of pixel driving circuits 7120 on the left side and right side of the opening are electrically connected through the first line 731 to transmit the gate scanning signal. Alternatively, a plurality of first lines 731 may be provided for each row of pixel driving circuits 7120 in the display region 701 on the left side and right side of the opening to transmit the above various electrical signals, respectively, and for example, the first lines 731 electrically connect the gate lines and the light-emitting control lines of each row of pixel driving circuits 7120 in the display region 701 on the left side and right side of the opening, respectively, so as to transmit the gate scanning signal and the light-emitting control signal, respectively. The embodiments of the present disclosure are not limited in this aspect.

For example, by providing the first conductive semiconductor pattern 720 (for example, the plurality of second lines 721 in the first conductive semiconductor pattern 720) below the first conductive pattern 730, capacitors can be formed by the plurality of second lines 721 and the plurality of first lines 731, thereby increasing the transmission loads of the first lines 731, and compensating for the electrical signal transmission effect of the first lines 731. Thus, the display effect of the pixel units in the display region 701 on the left side and right side of the opening may be consistent with the display effect of other pixel units in the display region 701, thereby avoiding or reducing the display abnormality of the image in different gray levels, and further improving the image display effect of the display substrate 70.

For example, the first conductive semiconductor pattern 720 is electrically connected to the second conductive pattern 740 through the via holes 750, and is further electrically connected to the first electrode layer 770, and for example, the first electrode layer 770 may be configured to receive a low voltage signal (for example, a cathode signal provided for the light-emitting element 7140), so that the plurality of second lines 721 in the first conductive semiconductor pattern 720 are applied with the low voltage signal, thereby allowing the capacitors to be formed by the first lines 731, which for example, transmit the gate scanning signals, and the second lines 721 to achieve the compensation effect.

In the following, the embodiments of the present disclosure take the case where one first line 731 is provided for each row of pixel driving circuits 7120 located in the display region 701 on the left side and right side of the opening to transmit the gate scanning signal (that is, the gate lines of each row of pixel driving circuits 7120 in the display region 701 on the left side and right side of the opening are electrically connected through the first line 731 to transmit the gate scanning signal) as an example to describe the display substrate 70 in connection with the specific structure of the pixel driving circuit 7120.

Figure 8:
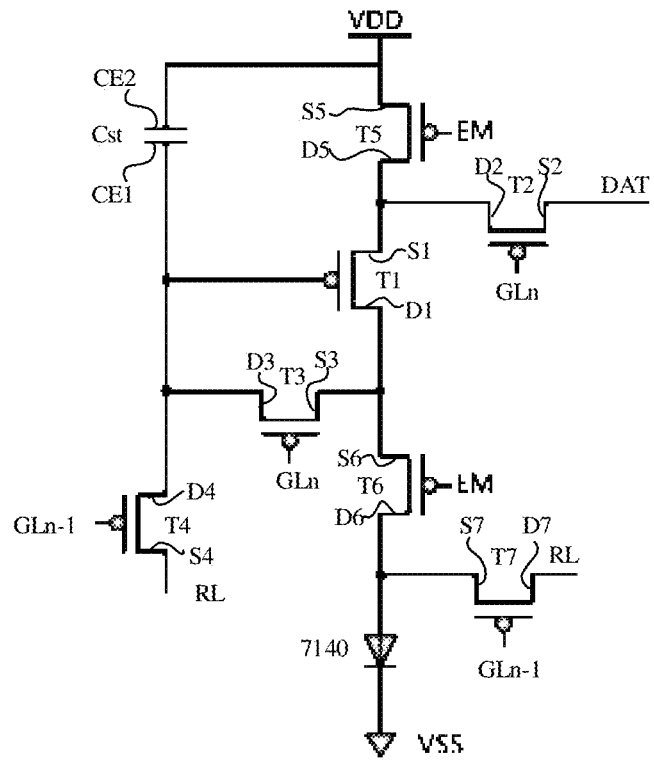
FIG. 8 is an equivalent circuit diagram of a pixel driving circuit in a display substrate provided by some embodiments of the present disclosure.
Figure 9A:
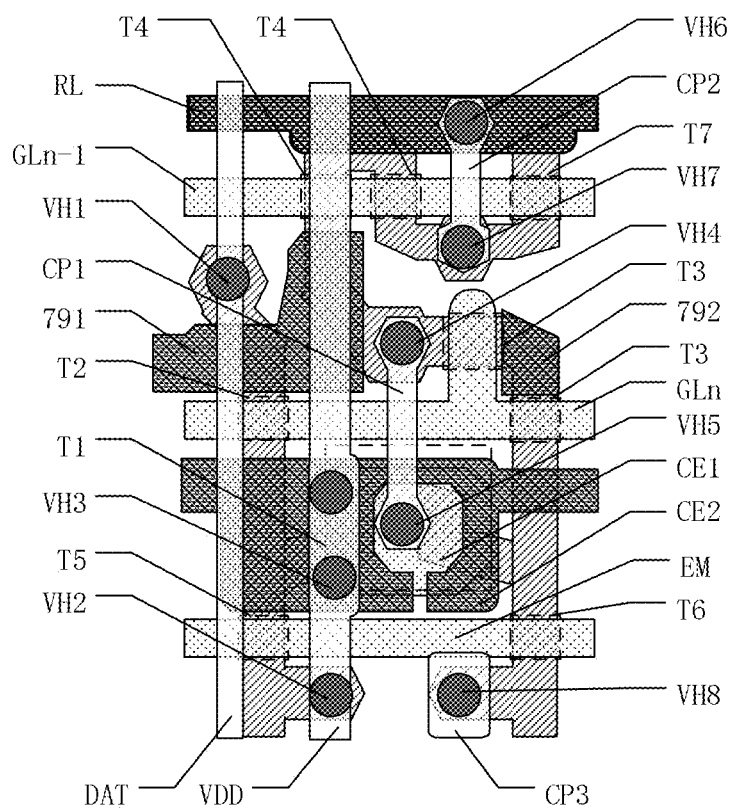
FIG. 9A to FIG. 9E are schematic diagrams of respective layers of a pixel driving circuit in a display substrate provided by some embodiments of the present disclosure.

FIG. 8 is an equivalent circuit diagram of a pixel driving circuit in a display substrate provided by some embodiments of the present disclosure, and FIG. 9A to FIG. 9E are schematic diagrams of respective layers of a pixel driving circuit in a display substrate provided by some embodiments of the present disclosure. For example, FIG. 7 is a schematic diagram of a partial cross-sectional structure of the display substrate 70 including the pixel driving circuit 7120 illustrated in FIG. 8 and FIG. 9A. It should be noted that the specific structure of the pixel driving circuit 7120 illustrated in FIG. 8 and FIG. 9A is only an exemplary description, and the embodiments of the present disclosure include the above examples but are not limited thereto.

In some embodiments, as illustrated in FIG. 8, the pixel driving circuit 7120 includes a plurality of thin film transistors T1, T2, T3, T4, T5, T6, and T7, and a plurality of signal lines and a storage capacitor Cst which are connected to the plurality of thin film transistors T1, T2, T3, T4, T5, T6, and T7. The plurality of signal lines include gate lines GL, a light-emitting control line EM, an initial line RL, a data line DAT, and a first power line VDD. The gate lines GL may include a first gate line GLn and a second gate line GLn-1, for example, the first gate line GLn may be used to transmit a gate scanning signal, and the second gate line GLn-1 may be used to transmit a reset signal. The light-emitting control line EM may be used to transmit a light-emitting control signal. Thus, the pixel driving circuit 7120 is a 7T1C (seven transistors and one capacitor) pixel driving circuit.

It should be noted that the embodiments of the present disclosure include the above examples but are not limited thereto, the pixel driving circuit 7120 may also adopt other types of circuit structures, such as a 7T2C (seven transistors and two capacitors) structure, a 9T2C (nine transistors and two capacitors) structure, or the like, and the embodiments of the present disclosure are not limited in this aspect.

For example, the first gate lines GLn of each row of pixel driving circuits 7120 located in the display region 701 on the left side and right side of the opening can be electrically connected through the first line 731 to transmit the gate scanning signal, thereby achieving the compensation effect of the gate scanning signal.

For example, as illustrated in FIG. 8, a first gate electrode G1 of the first thin film transistor T1 is electrically connected to a third drain electrode D3 of the third thin film transistor T3 and a fourth drain electrode D4 of the fourth thin film transistor T4. A first source electrode S1 of the first thin film transistor T1 is electrically connected to a second drain electrode D2 of the second thin film transistor T2 and a fifth drain electrode D5 of the fifth thin film transistor T5. A first drain electrode D1 of the first thin film transistor T1 is electrically connected to a third source electrode S3 of the third thin film transistor T3 and a sixth source electrode S6 of the sixth thin film transistor T6.

For example, as illustrated in FIG. 8, a second gate electrode G2 of the second thin film transistor T2 is configured to be electrically connected to the first gate line GLn to receive a gate scanning signal, a second source electrode S2 of the second thin film transistor T2 is configured to be electrically connected to the data line DAT to receive a data signal, and the second drain electrode D2 of the second thin film transistor T2 is electrically connected to the first source electrode S1 of the first thin film transistor T1.

For example, as illustrated in FIG. 8, a third gate electrode G3 of the third thin film transistor T3 is configured to be electrically connected to the first gate line GLn, the third source electrode S3 of the third thin film transistor T3 is electrically connected to the first drain electrode D1 of the first thin film transistor T1, and the third drain electrode D3 of the third thin film transistor T3 is electrically connected to the first gate electrode G1 of the first thin film transistor T1.

For example, as illustrated in FIG. 8, a fourth gate electrode G4 of the fourth thin film transistor T4 is configured to be electrically connected to the second gate line GLn-1 to receive a reset signal, a fourth source electrode S4 of the fourth thin film transistor T4 is configured to be electrically connected to the initial line RL to receive an initial signal, and the fourth drain electrode D4 of the fourth thin film transistor T4 is electrically connected to the first gate electrode G1 of the first thin film transistor T1.

For example, as illustrated in FIG. 8, a fifth gate electrode G5 of the fifth thin film transistor T5 is configured to be electrically connected to the light-emitting control line EM to receive a light-emitting control signal, a fifth source electrode S5 of the fifth thin film transistor T5 is configured to be electrically connected to the first power line VDD to receive a first power signal, and the fifth drain electrode D5 of the fifth thin film transistor T5 is electrically connected to the first source electrode S1 of the first thin film transistor T1.

For example, as illustrated in FIG. 8, a sixth gate electrode G6 of the sixth thin film transistor T6 is configured to be electrically connected to the light-emitting control line EM to receive a light-emitting control signal, the sixth source electrode S6 of the sixth thin film transistor T6 is electrically connected to the first drain electrode D1 of the first thin film transistor T1, and a sixth drain electrode D6 of the sixth thin film transistor T6 is electrically connected to a first display electrode (for example, an anode) of the light-emitting element 7140.

For example, as illustrated in FIG. 8, a seventh gate electrode G7 of the seventh thin film transistor T7 is configured to be electrically connected to the second gate line GLn-1 to receive a reset signal, a seventh source electrode S7 of the seventh thin film transistor T7 is electrically connected to the first display electrode (for example, an anode) of the light-emitting element 7140, and a seventh drain electrode D7 of the seventh thin film transistor T7 is configured to be electrically connected to the initial line RL to receive an initial signal. For example, the seventh drain electrode D7 of the seventh thin film transistor T7 may be connected to the fourth source electrode S4 of the fourth thin film transistor T4, so as to be electrically connected to the initial line RL.

For example, as illustrated in FIG. 8, the storage capacitor Cst includes a first capacitor electrode CE1 and a second capacitor electrode CE2. The second capacitor electrode CE2 is electrically connected to the first power line VDD, and the first capacitor electrode CE1 is electrically connected to the first gate electrode G1 of the first thin film transistor T1 and the third drain electrode D3 of the third thin film transistor T3.

For example, as illustrated in FIG. 8, a second display electrode (for example, a cathode) of the light-emitting element 7140 is electrically connected to a second power line VSS.

It should be noted that one of the first power line VDD and the second power line VSS is a power line providing a high voltage, and the other of the first power line VDD and the second power line VSS is a power line providing a low voltage. In the embodiments illustrated in FIG. 8, the first power line VDD provides a constant first voltage, and the first voltage is a positive voltage; and the second power line VSS provides a constant second voltage, and the second voltage may be a negative voltage. For example, in some examples, the second voltage may be a grounded voltage.

It should be noted that the reset signal and the initial signal may be the same signal.

For example, the first electrode layer 770 of the display substrate 70 may be configured to receive the second voltage provided by the second power line VSS, so that the second conductive pattern 740 electrically connected to the first electrode layer 770 and the first conductive semiconductor pattern 720 electrically connected to the second conductive pattern 740 are applied with the second voltage, and therefore, the capacitor can be formed by the first line 731, which is electrically connected to the first gate line GLn and transmits the gate scanning signal, and the second line 721 of the first conductive semiconductor pattern 720 to achieve the compensation effect.

It should be noted that, according to the characteristics of the transistors, the transistors may be divided into N-type transistors and P-type transistors. For clarity, the technical solutions of the present disclosure are illustrated by taking the transistors being the P-type transistors (for example, P-type MOS transistors) as an example. That is, in the descriptions of the present disclosure, the first transistor T1, the second transistor T2, the third transistor T3, the fourth transistor T4, the fifth transistor T5, the sixth transistor T6, and the seventh transistor T7 may all be P-type transistors. However, the transistors of the embodiments of the present disclosure are not limited to the P-type transistors, and those skilled in the art may also use N-type transistors (for example, N-type MOS transistors) to implement the functions of one or more transistors in the embodiments of the present disclosure according to actual needs.

It should be noted that the transistors used in the embodiments of the present disclosure may be thin film transistors, field effect transistors, or other switching compnents with the same characteristics. The thin film transistors may include oxide semiconductor thin film transistors, amorphous silicon thin film transistors, polycrystalline silicon thin film transistors, or the like. The source electrode and drain electrode of the transistor may be symmetrical in structure, so there is no difference in physical structure between the source electrode and drain electrode. In the embodiments of the present disclosure, the source electrodes and drain electrodes of all or part of the transistors are interchangeable as needed.

In some embodiments, as illustrated in FIG. 9A, the pixel driving circuit 7120 includes the above thin film transistors T1, T2, T3, T4, T5, T6, and T7, the storage capacitor Cst, and the first gate line GLn, the second gate line GLn-1, the light-emitting control line EM, the initial line RL, the data line DAT, and the first power line VDD which are connected to the thin film transistors T1, T2, T3, T4, T5, T6, and T7. In the following, the structure of the pixel driving circuit 7120 is described with reference to FIG. 8 and FIG. 9A to FIG. 9E.

For example, FIG. 9A is a schematic diagram of a stacked position relationship of a semiconductor layer, a first conductive layer, a second conductive layer, and a third conductive layer of the pixel driving circuit 7120.

Figure 9B:
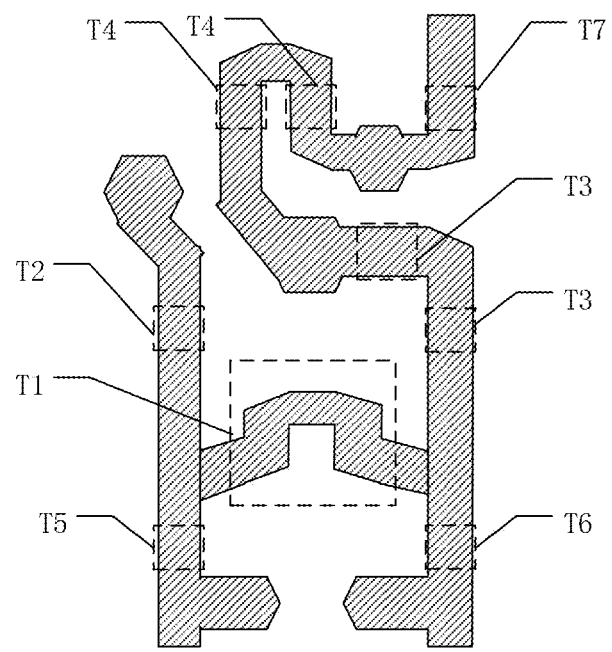

FIG. 9B illustrates the semiconductor layer of the pixel driving circuit 7120. For example, the semiconductor layer illustrated in FIG. 9B may be the active layer 7122 illustrated in FIG. 7. As illustrated in FIG. 9B, the semiconductor layer may be formed by patterning a semiconductor material. The semiconductor layer can be used to form active layers of the first thin film transistor T1, the second thin film transistor T2, the third thin film transistor T3, the fourth thin film transistor T4, the fifth thin film transistor T5, the sixth thin film transistor T6, and the seventh thin film transistor T7 described above, and each active layer may include a source region, a drain region, and a channel region between the source region and the drain region. For example, the semiconductor layer may be made of amorphous silicon, polycrystalline silicon, oxide semiconductor materials, or the like. It should be noted that the source region and drain region may be regions doped with n-type impurities or p-type impurities.

In the display substrate provided by some embodiments of the present disclosure, a gate insulating layer (such as the gate insulating layer 7128 illustrated in FIG. 7, which is not shown in FIG. 9A to FIG. 9E) is formed on the semiconductor layer to protect the semiconductor layer.

Figure 9C:
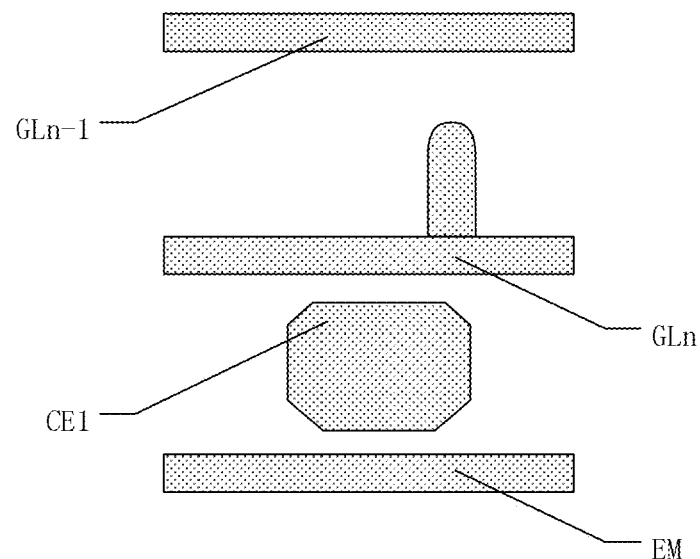

FIG. 9C illustrates the first conductive layer of the pixel driving circuit 7120. For example, as illustrated in FIG. 9C, the first conductive layer of the pixel driving circuit 7120 is provided on the gate insulating layer, and therefore, the first conductive layer is insulated from the semiconductor layer illustrated in FIG. 9B. The first conductive layer may include the first capacitor electrode CE1 of the storage capacitor Cst, the first gate line GLn, the second gate line GLn-1, the light-emitting control line EM, the gate electrode of the first thin film transistor T1, the gate electrode of the second thin film transistor T2, the gate electrode of the third thin film transistor T3, the gate electrode of the fourth thin film transistor T4, the gate electrode of the fifth thin film transistor T5, the gate electrode of the sixth thin film transistor T6, and the gate electrode of the seventh thin film transistor T7 (for example, the first gate electrode G1, the second gate electrode G2, the third gate electrode G3, the fourth gate electrode G4, the fifth gate electrode G5, the sixth gate electrode G6, and the seventh gate electrode G7 described above). As illustrated in FIG. 9C, the gate electrode of the second thin film transistor T2, the gate electrode of the fourth thin film transistor T4, the gate electrode of the fifth thin film transistor T5, the gate electrode of the sixth thin film transistor T6, and the gate electrode of the seventh thin film transistor T7 are portions of the first gate line GLn and the second gate line GLn-1 which overlap with the semiconductor layer. The third thin film transistor T3 may be a thin film transistor with a double-gate structure, one gate electrode of the third thin film transistor T3 may be a portion of the first gate line GLn that overlaps with the semiconductor layer, and the other gate electrode of the third thin film transistor T3 may be a protruding portion protruding from the first gate line GLn. The gate electrode of the first thin film transistor T1 may be the first capacitor electrode CE1. The fourth thin film transistor T4 may be a thin film transistor with a double-gate structure, and the two gate electrodes of the fourth thin film transistor T4 are portions of the second gate line GLn-1 which overlap with the semiconductor layer, respectively.

In the display substrate provided by some embodiments of the present disclosure, a first interlayer insulating layer (for example, the first interlayer insulating layer 7129 illustrated in FIG. 7, which is not shown in FIG. 9A to FIG. 9E) is formed on the first conductive layer to protect the first conductive layer.

Figure 9D:
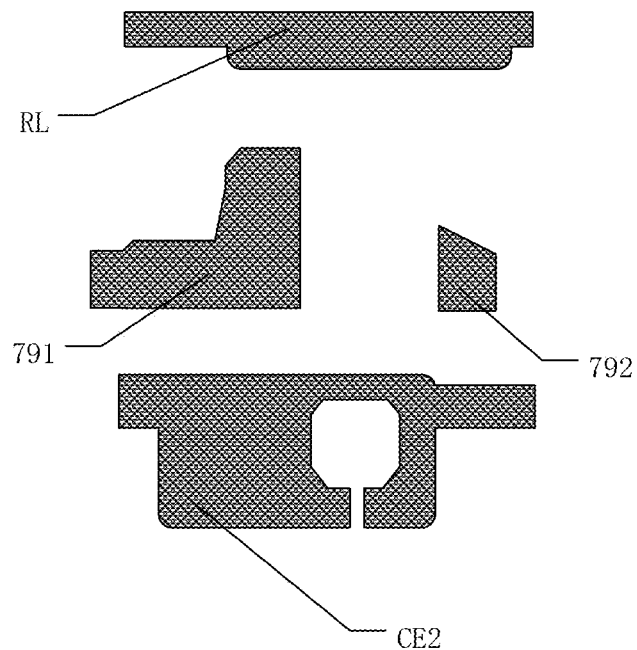

FIG. 9D illustrates the second conductive layer of the pixel driving circuit 7120. For example, as illustrated in FIG. 9D, the second conductive layer of the pixel driving circuit 7120 includes the second capacitor electrode CE2 of the storage capacitor Cst and the initial line RL. The second capacitor electrode CE2 at least partially overlaps with the first capacitor electrode CE1 to form the storage capacitor Cst.

In some embodiments, the second conductive layer may further include a first light-shielding portion 791 and a second light-shielding portion 792. An orthographic projection of the first light-shielding portion 791 on the base substrate 710 covers the active layer of the second thin film transistor T2 and the active layer between the drain electrode of the third thin film transistor T3 and the drain electrode of the fourth thin film transistor T4, thereby preventing external light from affecting the active layers of the second thin film transistor T2, the third thin film transistor T3, and the fourth thin film transistor T4. An orthographic projection of the second light-shielding portion 792 on the base substrate 710 covers the active layer between the two gate electrodes of the third thin film transistor T3, thereby preventing external light from affecting the active layer of the third thin film transistor T3. The first light-shielding portion 791 may form an integrated structure with the second light-shielding portion 792 of an adjacent pixel driving circuit, and the first light-shielding portion 791 is electrically connected to the first power line VDD through a via hole penetrating the second interlayer insulating layer.

In the display substrate provided by some embodiments of the present disclosure, a second interlayer insulating layer (such as the second interlayer insulating layer 7131 illustrated in FIG. 7, which is not shown in FIG. 9A to FIG. 9E) is formed on the second conductive layer to protect the second conductive layer.

Figure 9E:
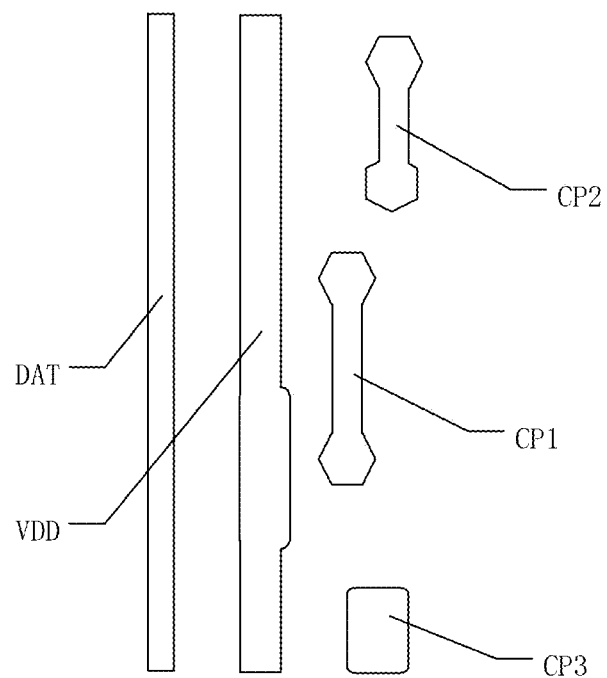

FIG. 9E illustrates the third conductive layer of the pixel driving circuit 7120. For example, as illustrated in FIG. 9E, the third conductive layer of the pixel driving circuit 7120 includes the data line DAT and the first power line VDD. As illustrated in FIG. 9A and FIG. 9E, the data line DAT is connected to the source region of the second thin film transistor T2 in the semiconductor layer through at least one via hole (for example, a via hole VH1) in the gate insulating layer, the first interlayer insulating layer, and the second interlayer insulating layer. The first power line VDD is connected to the source region of the fifth thin film transistor T5 in the semiconductor layer through at least one via hole (for example, a via hole VH2) in the gate insulating layer, the first interlayer insulating layer, and the second interlayer insulating layer. The first power line VDD is connected to the second capacitor electrode CE2 in the second conductive layer through at least one via hole (for example, a via hole VH3) in the second interlayer insulating layer.

For example, the third conductive layer further includes a first connection portion CP1, a second connection portion CP2, and a third connection portion CP3. One end of the first connection portion CP1 is connected to the drain region of the third thin film transistor T3 in the semiconductor layer through at least one via hole (for example, a via hole VH4) in the gate insulating layer, the first interlayer insulating layer, and the second interlayer insulating layer, and the other end of the first connection portion CP1 is connected to the gate electrode of the first thin film transistor T1 through at least one via hole (for example, a via hole VH5) in the first interlayer insulating layer and the second interlayer insulating layer. One end of the second connection portion CP2 is connected to the initial line RL through a via hole (for example, a via hole VH6) in the second interlayer insulating layer, and the other end of the second connection portion CP2 is connected to the source region of the seventh thin film transistor T7 and the source region of the fourth thin film transistor T4 in the semiconductor layer through at least one via hole (for example, a via hole VH7) in the gate insulating layer, the first interlayer insulating layer, and the second interlayer insulating layer. The third connection portion CP3 is connected to the drain region of the sixth thin film transistor T6 in the semiconductor layer through at least one via hole (for example, a via hole VH8) in the gate insulating layer, the first interlayer insulating layer, and the second interlayer insulating layer.

In the display substrate provided by some embodiments of the present disclosure, a protection layer (such as the first planarization layer 7150 illustrated in FIG. 7, which is not shown in FIG. 9A to FIG. 9E) is formed on the third conductive layer to protect the third conductive layer. The first display electrode (for example, an anode) of the light-emitting element 7140 in the pixel structure may be disposed on the protection layer.

For example, the first line 731 of the first conductive pattern 730 may be disposed in the same layer as the second capacitor electrode CE2 in the second conductive layer, and the first line 731 may be connected to the first gate line GLn in the first conductive layer through at least one via hole in the first interlayer insulating layer.

For example, with reference to the pixel driving circuit 7120 illustrated in FIG. 8 and FIG. 9A, FIG. 7 is a schematic diagram of a partial cross-sectional structure of the display substrate 70 including the pixel driving circuit 7120 illustrated in FIG. 8 and FIG. 9A.

In some embodiments, as illustrated in FIG. 7, the pixel structure further includes a buffer layer 7121 on the base substrate 710, and the pixel driving circuit 7120 may include an active layer 7122 (such as the semiconductor layer of the pixel driving circuit 7120 illustrated in FIG. 9B) on the buffer layer 7121, a gate insulating layer 7128 on a side of the active layer 7122 away from the base substrate 710, a gate electrode 7130 on the gate insulating layer 7128 (for example, in the first conductive layer of the pixel driving circuit 7120 illustrated in FIG. 9C), a first interlayer insulating layer 7129 on a side of the gate electrode 7130 away from the base substrate 710, a second interlayer insulating layer 7131 on the first interlayer insulating layer 7129, and a source electrode 7125 and a drain electrode 7126 on the second interlayer insulating layer 7131.

For example, the first conductive semiconductor pattern 720 (for example, the plurality of second lines 721 in the first conductive semiconductor pattern 720) may be provided in the same layer as the active layer 7122. For example, the first insulating layer 761 may be provided in the same layer as the first interlayer insulating layer 7129, and the second insulating layer 762 may be provided in the same layer as the second interlayer insulating layer 7131. For example, the source electrode 7125 and the drain electrode 7126 may be provided in the same layer as the second conductive pattern 740. For example, the above structures or functional layers provided in the same layer may be formed in the same layer in the manufacturing process, and for example, may be formed by the patterning process using the same material layer, thereby simplifying the manufacturing process of the display substrate 70 and reducing the manufacturing cost of the display substrate 70.

For example, the buffer layer 7121 serves as a transition layer, which can prevent harmful substances in the base substrate 710 from invading the inside of the display substrate 70, and can also increase the adhesion of the film layer of the display substrate 70 on the base substrate 710. For example, the material of the buffer layer 7121 may include an insulating material such as silicon oxide, silicon nitride, silicon oxynitride, or the like. For example, the material of one or more of the first interlayer insulating layer 7129, the second interlayer insulating layer 7131, and the gate insulating layer 7128 may include an insulating material such as silicon oxide, silicon nitride, silicon oxynitride, or the like. The materials of the first interlayer insulating layer 7129, the second interlayer insulating layer 7131, and the gate insulating layer 7128 may be the same as or different from each other, which is not limited in the embodiments of the present disclosure.

For example, as illustrated in FIG. 7, the active layer 7122 may include a source region 7123, a drain region 7124, and a channel region between the source region 7123 and the drain region 7124. The first interlayer insulating layer 7129, the second interlayer insulating layer 7131, and the gate insulating layer 7128 have via holes to expose the source region 7123 and the drain region 7124. The source electrode 7125 and the drain electrode 7126 are electrically connected to the source region 7123 and the drain region 7124 through the via holes, respectively. The gate electrode 7130 overlaps with the channel region between the source region 7123 and the drain region 7124 in the active layer 7122 in a direction perpendicular to the base substrate 710.

For example, the first planarization layer 7150 is above the source electrode 7125 and the drain electrode 7126 for planarizing the surface of the side of the pixel driving circuit 7120 away from the base substrate 710. The first planarization layer 7150 can planarize the uneven surface caused by the pixel driving circuit 7120, and thus prevent defects generated in the light-emitting element 7140 caused by the concave-convex caused by the pixel driving circuit 7120.

For example, the first planarization layer 7150 may be disposed in the same layer as the third insulating layer 763 in the first peripheral region 703. Therefore, both the first planarization layer 7150 and the third insulating layer 763 may be formed in the same layer in the manufacturing process, and for example, may be formed by the patterning process using the same material layer.

For example, the material of the active layer 7122 may include polysilicon or oxide semiconductors (for example, indium gallium zinc oxide). The material of the gate electrode 7130 may include a metal material or an alloy material, and the gate electrode 7130 may be a metal single-layer structure or a metal multi-layer structure formed by molybdenum, aluminum, titanium, or the like. For example, the multi-layer structure is a stacked layer of a plurality of metal layers (e.g., a three-layer metal stack of aluminum, titanium, and aluminum (Al/Ti/Al)). The materials of the source electrode 7125 and the drain electrode 7126 may include metal materials or alloy materials, and the source electrode 7125 and the drain electrode 7126 may be metal single-layer structures or metal multi-layer structures formed by molybdenum, aluminum, titanium, or the like. For example, the multi-layer structure is a stacked layer of a plurality of metal layers (e.g., a three-layer metal stack of aluminum, titanium, and aluminum (Al/Ti/Al)). The embodiments of the present disclosure do not specifically limit the material of each structure or functional layer.

For example, as illustrated in FIG. 7, a via hole is formed in the first planarization layer 7150 to expose the source electrode 7125 or the drain electrode 7126 (FIG. 7 illustrates the case of exposing the drain electrode 7126), and the light-emitting element 7140 is formed on the first planarization layer 7150. The light-emitting element 7140 includes the first display electrode 7141 (for example, an anode), the light-emitting layer 7142, and the second display electrode 7143 (for example, a cathode). The first display electrode 7141 of the light-emitting element 7140 is electrically connected to the drain electrode 7126 through the via hole in the first planarization layer 7150. The pixel definition layer 7144 is formed on the first display electrode 7141, and the pixel definition layer 7144 includes a plurality of openings to define a plurality of pixel units. Each of the plurality of openings exposes the first display electrode 7141, and the light-emitting layer 7142 is disposed in the plurality of openings of the pixel definition layer 7144. The second display electrode 7143 may be, for example, disposed in a part of the display region 701 or the entire display region 701, so that the second display electrode 7143 can be formed over the entire surface in the manufacturing process.

For example, the first display electrode 7141 may be disposed in the same layer as the first electrode layer 770 in the first peripheral region 703. Therefore, both the first display electrode 7141 and the first electrode layer 770 can be formed in the same layer in the manufacturing process, and for example, may be formed by the patterning process using the same material layer.

For example, the pixel definition layer 7144 may be disposed in the same layer as the fourth insulating layer 764 in the first peripheral region 703. Therefore, both the pixel definition layer 7144 and the fourth insulating layer 764 can be formed in the same layer in the manufacturing process, and for example, may be formed by the patterning process using the same material layer.

For example, the first display electrode 7141 may include a reflection layer, and the second display electrode 7143 may include a transparent layer or a semi-transparent layer. Thus, the first display electrode 7141 can reflect the light emitted from the light-emitting layer 7142, and this part of light is emitted to the external environment through the second display electrode 7143, thereby improving the light-emitting efficiency. In the case where the second display electrode 7143 includes the semi-transparent layer, part of light reflected by the first display electrode 7141 is reflected again by the second display electrode 7143, and therefore, the first display electrode 7141 and the second display electrode 7143 form a resonance structure, thereby improving the light-emitting efficiency.

For example, a material of the first display electrode 7141 may include at least one transparent conductive oxide material, which may include indium tin oxide (ITO), indium zinc oxide (IZO), zinc oxide (ZnO), etc. In addition, the first display electrode 7141 may include a metal having high reflectivity as the reflection layer, such as silver (Ag).

For example, in the case where the display substrate 70 is an organic light-emitting diode (OLED) display substrate, the light-emitting layer 7142 may include a small molecule organic material or a polymer molecule organic material, which may be a fluorescent light-emitting material or a phosphorescent light-emitting material, and may emit red light, green light, blue light, white light, etc. In addition, according to different actual needs, in different examples, the light-emitting layer 7142 may further include functional layers such as an electron injection layer, an electron transport layer, a hole injection layer, a hole transport layer, etc.

In the case where the display substrate 70 is a quantum dot light-emitting diode (QLED) display substrate, the light-emitting layer 7142 may include a quantum dot material, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc. The particle sizes of the quantum dots are 2 nm to 20 nm.

For example, the second display electrode 7143 may include various conductive materials. For example, the second display electrode 7143 may include a metal material such as lithium (Li), aluminum (Al), magnesium (Mg), silver (Ag), etc.

For example, the material of the pixel definition layer 7144 may include an organic insulating material, such as polyimide, poly-phthalimide, polyamide, acrylic resin, benzo-cyclobutene, phenolic resin, or the like, or may include an inorganic insulating material, such as silicon oxide, silicon nitride, or the like, and the embodiments of the present disclosure are not limited in this aspect.

For example, as illustrated in FIG. 7, the display substrate 70 further includes an encapsulation layer 7160 on the light-emitting element 7140. The encapsulation layer 7160 seals the light-emitting element 7140, so that the deterioration of the light-emitting element 7140 caused by moisture and/or oxygen in the environment may be reduced or prevented. The encapsulation layer 7160 may be a single-layer structure or a composite-layer structure, and the composite-layer structure includes a structure in which the inorganic layer and the organic layer are stacked. For example, the encapsulation layer 7160 may include a first inorganic encapsulation layer 7161 (that is, the first encapsulation layer 781), a first organic encapsulation layer 7162, and a second inorganic encapsulation layer 7163 (that is, the second encapsulation layer 782) which are sequentially disposed.

For example, the material of the encapsulation layer 7160 may include an insulating material, such as silicon nitride, silicon oxide, silicon oxynitride, polymer resins, or the like. The inorganic insulating materials such as silicon nitride, silicon oxide, silicon oxynitride, and the like have high density and may prevent the intrusion of water, oxygen, or the like. The material of the first organic encapsulation layer 7162 may be a polymer material containing a desiccant or a polymer material that can block moisture. For example, the material such as the polymer resin can planarize the surface of the display region 701 of the display substrate 70, and relieve the stress of the first inorganic encapsulation layer 7161 and the second inorganic encapsulation layer 7163, and the material may further include a water-absorbing material, such as a desiccant, to absorb substances such as water, oxygen, and the like which invade into the inside.

For example, as illustrated in FIG. 7, the pixel driving circuit 7120 may further include a first display metal layer 7127 (for example, the third conductive layer of the pixel driving circuit 7120 illustrated in FIG. 9E). The first display metal layer 7127 includes the source electrode 7125 and the drain electrode 7126 in the thin film transistor of the pixel driving circuit 7120 illustrated in FIG. 7, and may also include other electrodes in the circuit not shown in the figure.

For example, as illustrated in FIG. 7, the display substrate 70 further includes a storage capacitor 7170 (such as the storage capacitor Cst illustrated in FIG. 8 and FIG. 9A), and the storage capacitor 7170 may include a first capacitor electrode 7171 (such as the first capacitor electrode CE1 of the storage capacitor Cst illustrated in FIG. 8 and FIG. 9C) and a second capacitor electrode 7172 (such as the second capacitor electrode CE2 of the storage capacitor Cst illustrated in FIG. 8 and FIG. 9D). The first capacitor electrode 7171 is disposed between the gate insulating layer 7128 and the first interlayer insulating layer 7129 (for example, located in the first conductive layer of the pixel driving circuit 7120 illustrated in FIG. 9C), and the second capacitor electrode 7172 is disposed between the first interlayer insulating layer 7129 and the second interlayer insulating layer 7131 (for example, located in the second conductive layer of the pixel driving circuit 7120 illustrated in FIG. 9D). The first capacitor electrode 7171 and the second capacitor electrode 7172 are stacked with each other, and at least partially overlap with each other in the direction perpendicular to the base substrate 710. The first capacitor electrode 7171 and the second capacitor electrode 7172 use the first interlayer insulating layer 7129 as the dielectric material to form the storage capacitor 7170.

For example, the second capacitor electrode 7172 may be disposed in the same layer as the first conductive pattern 730 in the first peripheral region 703. Therefore, the second capacitor electrode 7172 and the first conductive pattern 730 may be formed in the same layer in the manufacturing process, and for example, may be formed by the patterning process using the same material layer, thereby simplifying the manufacturing process of the display substrate 70 and reducing the manufacturing cost of the display substrate 70.

For example, in some other embodiments of the present disclosure, the first capacitor electrode of the storage capacitor is still disposed in the same layer as the gate electrode, and the second capacitor electrode of the storage capacitor is disposed in the same layer as the source electrode and the drain electrode of the thin film transistor, so that the first capacitor electrode and the second capacitor electrode can use a stack of the first interlayer insulating layer and the second interlayer insulating layer as the dielectric material to form the storage capacitor.

For example, in some other embodiments of the present disclosure, the first capacitor electrode of the storage capacitor is no longer provided in the same layer as the gate electrode, but is located between the first interlayer insulating layer and the second interlayer insulating layer, and the second capacitor electrode of the storage capacitor is provided in the same layer as the source electrode and the drain electrode of the thin film transistor, so that the first capacitor electrode and the second capacitor electrode use the second interlayer insulating layer as the dielectric material to form the storage capacitor.

It should be noted that the cross-sectional structure of the display region of the display substrate 20 illustrated in FIG. 2C and the cross-sectional structure of the display region of the display substrate 40 illustrated in FIG. 4 may also adopt a structure the same as or similar to that of the display region 701 of the display substrate 70 illustrated in FIG. 7, or may also adopt other suitable structures, and the embodiments of the present disclosure are not limited in this aspect.

For example, the display substrate provided by the embodiments of the present disclosure, for example, the display substrate 20, the display substrate 30, the display substrate 40, the display substrate 50, and the display substrate 70, may be an organic light-emitting diode display substrate.

For example, the display substrate provided by the embodiments of the present disclosure may also be a substrate with a display function, such as a quantum dot light-emitting diode display substrate, an electronic paper display substrate, etc., or other types of substrates, and the embodiments of the present disclosure are not limited in this aspect.

At least one embodiment of the present disclosure further provides a manufacturing method of a display substrate, and the manufacturing method includes: providing a base substrate; forming a first conductive semiconductor pattern on the base substrate; forming a first conductive pattern on the first conductive semiconductor pattern, where the first conductive pattern is spaced apart and insulated from the first conductive semiconductor pattern to form a capacitor; and forming a second conductive pattern on the first conductive pattern, where the second conductive pattern is spaced apart and insulated from the first conductive pattern to form a capacitor. The display substrate includes a display region and a peripheral region around the display region, the display region includes an opening, and the peripheral region includes a first peripheral region at least partially around the opening. The first peripheral region includes a first dam region, a second dam region, and an interval region, the first dam region is at least partially around the opening, the interval region is at least partially around the first dam region, and the second dam region is at least partially around the interval region. The first conductive pattern is configured to transmit an electrical signal for the display region. The second conductive pattern is electrically connected to the first conductive semiconductor pattern through a plurality of via holes in the first peripheral region. The first conductive semiconductor pattern, the first conductive pattern, and the second conductive pattern are at least in the first dam region and the interval region, and an arrangement density of the plurality of via holes in the interval region is smaller than an arrangement density of the plurality of via holes in the first dam region.

For example, in the manufacturing method of the display substrate provided by at least one embodiment of the present disclosure, forming the first conductive pattern on the first conductive semiconductor pattern includes: forming a first insulating layer on the first conductive semiconductor pattern, and forming the first conductive pattern on the first insulating layer. Forming the second conductive pattern on the first conductive pattern includes: forming a second insulating layer on the first conductive pattern, and forming the second conductive pattern on the second insulating layer. The plurality of via holes are at least in the first insulating layer and the second insulating layer and at least penetrate the first insulating layer and the second insulating layer.

For example, the manufacturing method of the display substrate provided by at least one embodiment of the present disclosure further includes: forming a first electrode layer on the second conductive pattern. The first electrode layer is electrically connected to the second conductive pattern. In the interval region, the first electrode layer covers the second conductive pattern, and a surface of a side of the first electrode layer facing the base substrate is in contact with a surface of a side of the second conductive pattern away from the base substrate.

For example, the manufacturing method of the display substrate provided by at least one embodiment of the present disclosure further includes: forming a first encapsulation layer on the first electrode layer. In the interval region, the first encapsulation layer covers the first electrode layer, and a surface of a side of the first encapsulation layer facing the base substrate is in contact with a surface of a side of the first electrode layer away from the base substrate.

For example, the manufacturing method of the display substrate provided by at least one embodiment of the present disclosure further includes: forming a pixel driving circuit of a pixel structure on the base substrate in the display region. The pixel driving circuit includes a thin film transistor and a storage capacitor, the thin film transistor includes a gate electrode, an active layer, a source electrode, and a drain electrode, and the storage capacitor includes a first capacitor electrode and a second capacitor electrode opposite to the first capacitor electrode. The active layer and the first conductive semiconductor pattern are in an identical layer, the second capacitor electrode and the first conductive pattern are in an identical layer, and the source electrode, the drain electrode, and the second conductive pattern are in an identical layer.

For example, in the manufacturing method of the display substrate provided by at least one embodiment of the present disclosure, the first capacitor electrode and the gate electrode are in an identical layer.

For example, the display substrate provided by the embodiments of the present disclosure, such as the display substrate 20, the display substrate 30, the display substrate 40, the display substrate 50, or the display substrate 70 described above, may be manufactured by the manufacturing method of the display substrate provided by the embodiments of the present disclosure.

The technical effects of the manufacturing method of the display substrate provided by the embodiments of the present disclosure may be with reference to the technical effects of the above display substrates provided by the embodiments of the present disclosure, and details are not described herein again.

At least one embodiment of the present disclosure further provides a display device, and the display device includes the display substrate provided by any one of the embodiments of the present disclosure, for example, the display substrate 20, the display substrate 30, the display substrate 40, the display substrate 50, or the display substrate 70.

The structure, function and technical effects of the display device provided by the embodiments of the present disclosure may be with reference to the corresponding descriptions of the display substrate provided by the embodiments of the present disclosure described above, and details are not described herein again, For example, the display device provided by the embodiments of the present disclosure may be an organic light-emitting diode display device. Alternatively, the display device provided by the embodiments of the present disclosure may also be a device with a display function, such as a quantum dot light-emitting diode display device, an electronic paper display device, etc., or other types of devices. The embodiments of the present disclosure are not limited in this aspect.

For example, the display device provided by the embodiments of the present disclosure may be any product or component with a display function, such as a display substrate, a display panel, an electronic paper, a mobile phone, a tablet computer, a television, a display, a notebook computer, a digital photo frame, a navigator, etc., and the embodiments of the present disclosure are not limited in this aspect.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, features in one embodiment or in different embodiments can be combined to obtain new embodiments.

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising a display region and a peripheral region around the display region,
   wherein the display region comprises an opening, and the peripheral region comprises a first peripheral region at least partially around the opening;
   the first peripheral region comprises a first dam region, a second dam region, and an interval region, the first dam region is at least partially around the opening, the interval region is at least partially around the first dam region, and the second dam region is at least partially around the interval region;
   the display substrate comprises a base substrate, a first conductive semiconductor pattern, a first conductive pattern, and a second conductive pattern;
   the first conductive semiconductor pattern is on the base substrate, the first conductive pattern is on a side of the first conductive semiconductor pattern away from the base substrate, and is spaced apart and insulated from the first conductive semiconductor pattern to form a capacitor, and
   the second conductive pattern is on a side of the first conductive pattern away from the first conductive semiconductor pattern, and is spaced apart and insulated from the first conductive pattern to form a capacitor;
   the first conductive pattern is configured to transmit an electrical signal for the display region;
   the second conductive pattern is electrically connected to the first conductive semiconductor pattern through a plurality of via holes in the first peripheral region; and
   the first conductive semiconductor pattern, the first conductive pattern, and the second conductive pattern are at least in the first dam region and the interval region, and an arrangement density of the plurality of via holes in the interval region is smaller than an arrangement density of the plurality of via holes in the first dam region.

2. The display substrate according to claim 1, further comprising a first insulating layer and a second insulating layer,
   wherein the first insulating layer is on a side of the first conductive semiconductor pattern away from the base substrate, the first conductive pattern is on a side of the first insulating layer away from the first conductive semiconductor pattern, the second insulating layer is on a side of the first conductive pattern away from the first insulating layer, and the second conductive pattern is on a side of the second insulating layer away from the first conductive pattern; and
   the plurality of via holes are at least in the first insulating layer and the second insulating layer and at least penetrate the first insulating layer and the second insulating layer.

3. The display substrate according to claim 1, wherein the arrangement density of the plurality of via holes in the interval region is 0.

4. The display substrate according to claim 1, wherein the first conductive semiconductor pattern and the second conductive pattern are further in the second dam region.

5. The display substrate according to claim 4, wherein the first conductive pattern is further in the second dam region.

6. The display substrate according to claim 4 or 5, wherein the arrangement density of the plurality of via holes in the interval region is smaller than an arrangement density of the plurality of via holes in the second dam region.

7. The display substrate according to claim 2, wherein in the interval region, an orthographic projection of the second conductive pattern on the base substrate overlaps with an orthographic projection of the second insulating layer on the base substrate, and an area of the orthographic projection of the second conductive pattern on the base substrate is equal to an area of the orthographic projection of the second insulating layer on the base substrate.

8. The display substrate according to claim 1, further comprising a first electrode layer,
   wherein the first electrode layer is on a side of the second conductive pattern away from the base substrate and is electrically connected to the second conductive pattern; and
   in the interval region, the first electrode layer covers the second conductive pattern, and a surface of a side of the first electrode layer facing the base substrate is in contact with a surface of a side of the second conductive pattern away from the base substrate.

9. The display substrate according to claim 8, further comprising a first encapsulation layer,
   wherein the first encapsulation layer is on a side of the first electrode layer away from the base substrate; and
   in the interval region, the first encapsulation layer covers the first electrode layer, and a surface of a side of the first encapsulation layer facing the base substrate is in contact with a surface of a side of the first electrode layer away from the base substrate.

10. The display substrate according to claim 9, further comprising a first dam structure and a second dam structure,
    wherein the first dam structure is in the first dam region, and the second dam structure is in the second dam region;
    in the first dam region, the first dam structure is on a side of the first electrode layer away from the base substrate, and the first encapsulation layer is on a side of the first dam structure away from the first electrode layer and covers the first dam structure; and
    in the second dam region, the second dam structure is on a side of the second conductive pattern away from the base substrate, a portion of the second dam structure covers the first electrode layer, and the first encapsulation layer is on a side of the first electrode layer and the second dam structure away from the second conductive pattern and covers the first electrode layer and the second dam structure.

11. The display substrate according to claim 10, wherein a maximum distance between the base substrate and a surface of a side of a portion of the first encapsulation layer in the first dam region away from the base substrate is greater than a maximum distance between the base substrate and a surface of a side of a portion of the first encapsulation layer in the interval region away from the base substrate, and
 a maximum distance between the base substrate and a surface of a side of a portion of the first encapsulation layer in the second dam region away from the base substrate is greater than the maximum distance between the base substrate and the surface of the side of the portion of the first encapsulation layer in the interval region away from the base substrate.

12. The display substrate according to claim 11, wherein the maximum distance between the base substrate and the surface of the side of the portion of the first encapsulation layer in the first dam region away from the base substrate is greater than the maximum distance between the base substrate and the surface of the side of the portion of the first encapsulation layer in the second dam region away from the base substrate.

13. The display substrate according to claim 10, further comprising a third insulating layer, a fourth insulating layer, and a fifth insulating layer in the first peripheral region except for the interval region,
 wherein the first dam structure comprises a stack of the fourth insulating layer and the fifth insulating layer, and the second dam structure comprises a stack of the third insulating layer, the fourth insulating layer, and the fifth insulating layer;
 in the first dam region, the fourth insulating layer is on a side of the first electrode layer away from the base substrate, and the fifth insulating layer is on a side of the fourth insulating layer away from the first electrode layer,
 the first encapsulation layer is on a side of the fifth insulating layer away from the fourth insulating layer, and covers a surface of a side of the fifth insulating layer away from the base substrate, a side surface of at least one side of the fifth insulating layer, and a side surface of at least one side of the fourth insulating layer;
 in the second dam region, the third insulating layer is on a side of the second conductive pattern away from the base substrate, the first electrode layer covers a portion of a surface of a side of the third insulating layer away from the base substrate and a side surface of a side of the third insulating layer close to the first dam region, the fourth insulating layer is on a side of the third insulating layer and the first electrode layer away from the second conductive pattern, and the fifth insulating layer is on a side of the fourth insulating layer away from the third insulating layer and the first electrode layer; and
 the first encapsulation layer is on a side of the fifth insulating layer away from the fourth insulating layer, and covers a surface of a side of the fifth insulating layer away from the base substrate, a side surface of at least one side of the fifth insulating layer, a side surface of at least one side of the fourth insulating layer, a portion of a surface of a side of the third insulating layer away from the base substrate, and a side surface of a side of the third insulating layer away from the first dam region.

14. The display substrate according to claim 13, wherein in the second dam region, the third insulating layer covers a portion of a surface of a side of the second conductive pattern away from the base substrate and a side surface of a side of the second conductive pattern away from the first dam region.

15. The display substrate according to claim 9, further comprising a second encapsulation layer,
 wherein the second encapsulation layer is on a side of the first encapsulation layer away from the first electrode layer and covers the first encapsulation layer.

16. The display substrate according to claim 1, wherein the first conductive pattern comprises a plurality of first lines arranged side by side in a first direction, and
 the first conductive semiconductor pattern comprises a plurality of second lines arranged side by side in a second direction, the first direction being different from the second direction.

17. The display substrate according to claim 1, further comprising a pixel structure in the display region,
 wherein the pixel structure comprises a pixel driving circuit on the base substrate, and the pixel driving circuit comprises a thin film transistor and a storage capacitor;
 the thin film transistor comprises a gate electrode, an active layer, a source electrode, and a drain electrode, and the storage capacitor comprises a first capacitor electrode and a second capacitor electrode opposite to the first capacitor electrode; and
 the active layer and the first conductive semiconductor pattern are in an identical layer, the second capacitor electrode and the first conductive pattern are in an identical layer, and the source electrode, the drain electrode, and the second conductive pattern are in an identical layer.

18. The display substrate according to claim 17, wherein the pixel structure further comprises a first planarization layer and a light-emitting element,
 the first planarization layer is on a side of the pixel driving circuit away from the base substrate to provide a first planarization surface, and comprises a first via hole,
 the light-emitting element is on the first planarization surface, and is electrically connected to the pixel driving circuit through the first via hole, and
 in a case where the display substrate comprises a third insulating layer, the third insulating layer and the first planarization layer are in an identical layer.

19. A display substrate, comprising a display region and a peripheral region around the display region,
 wherein the display region comprises an opening, and the peripheral region comprises a first peripheral region at least partially around the opening;
 the first peripheral region comprises a first dam region, a second dam region, and an interval region, the first dam region is at least partially around the opening, the interval region is at least partially around the first dam region, and the second dam region is at least partially around the interval region;
 the display substrate comprises a base substrate, a first conductive semiconductor pattern, a first conductive pattern, and a second conductive pattern;
 the first conductive semiconductor pattern is on the base substrate, the first conductive pattern is on a side of the first conductive semiconductor pattern away from the base substrate, and is spaced apart and insulated from the first conductive semiconductor pattern to form a capacitor, and the second conductive pattern is on a side of the first conductive pattern away from the first conductive semiconductor pattern, and is spaced apart and insulated from the first conductive pattern to form a capacitor;

the first conductive pattern is configured to transmit an electrical signal for the display region;

the second conductive pattern is electrically connected to the first conductive semiconductor pattern through a plurality of via holes in the first peripheral region; and the first conductive semiconductor pattern, the first conductive pattern, and the second conductive pattern are at least in the second dam region and the interval region, and an arrangement density of the plurality of via holes in the interval region is smaller than an arrangement density of the plurality of via holes in the second dam region.

20. A display device, comprising the display substrate according to claim 1.

* * * * *

UNITED STATES PATENT AND TRADEMARK OFFICE
CERTIFICATE OF CORRECTION

PATENT NO. : 11,882,734 B2
APPLICATION NO. : 16/977526
DATED : January 23, 2024
INVENTOR(S) : Bo Zhang It is certified that error appears in the above-identified patent and that said Letters Patent is hereby corrected as shown below:

In the Claims

Column 36, Line 21, that portion of the sentence reading:
"according to claim 4 or 5"
Should read:
--according to claim 4--.

Signed and Sealed this
Thirtieth Day of April, 2024

Katherine Kelly Vidal
*Director of the United States Patent and Trademark Office*